US 011921385B2

(12) United States Patent
Hou et al.

(10) Patent No.: US 11,921,385 B2
(45) Date of Patent: Mar. 5, 2024

(54) DISPLAY DEVICE AND ARRAY SUBSTRATE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Jingwei Hou, Beijing (CN); Jingyi Xu, Beijing (CN); Yanwei Ren, Beijing (CN); Wenlong Zhang, Beijing (CN); Yanan Yu, Beijing (CN); Lei Jia, Beijing (CN); Yanhao Sun, Beijing (CN); Guolei Zhi, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,612

(22) PCT Filed: Aug. 12, 2021

(86) PCT No.: PCT/CN2021/112285
§ 371 (c)(1),
(2) Date: Jun. 28, 2022

(87) PCT Pub. No.: WO2022/062754
PCT Pub. Date: Mar. 31, 2022

(65) Prior Publication Data
US 2023/0036030 A1    Feb. 2, 2023

(30) Foreign Application Priority Data
Sep. 23, 2020   (CN) .......................... 202011008217.9

(51) Int. Cl.
G02F 1/1362      (2006.01)
G02F 1/1368      (2006.01)
G06F 3/041       (2006.01)

(52) U.S. Cl.
CPC .. *G02F 1/136254* (2021.01); *G02F 1/136209* (2013.01); *G02F 1/1368* (2013.01); *G06F 3/0412* (2013.01)

(58) Field of Classification Search
CPC ......... G02F 1/136254; G02F 1/136209; G02F 1/1368; G06F 3/0412
See application file for complete search history.

(56) References Cited

U.S. PATENT DOCUMENTS 9,406,664 B2    8/2016  Chen et al.
10,935,855 B2   3/2021  Kim et al.
(Continued)

FOREIGN PATENT DOCUMENTS

CN    103022052 A    4/2013
CN    107577099 A    1/2018
(Continued)

*Primary Examiner* — Hoan C Nguyen
(74) *Attorney, Agent, or Firm* — Leason Ellis LLP

(57) ABSTRACT

An array substrate of a display device includes a pixel electrode layer on a substrate, which includes active pixel electrodes in an active display region; outermost active pixel electrodes include a first active pixel electrode including a first pixel electrode edge and a second pixel electrode edge; in a first direction, the first pixel electrode edge is between the second pixel electrode edge and a frame region. One of the array substrate and an opposite substrate of the display device includes a common electrode layer including a first extended common electrode which includes a first extended portion extending beyond the first active pixel electrode; a first extended portion edge of the first extended portion and a first substrate edge of the substrate respectively extend in (Continued)

a second direction; in the first direction, the first extended portion edge is located between the first substrate edge and the first pixel electrode edge.

20 Claims, 13 Drawing Sheets

(56) References Cited

U.S. PATENT DOCUMENTS

| | | | |
|---|---|---|---|
| 11,092,865 B2 | 8/2021 | Cheng | |
| 2010/0073587 A1 | 3/2010 | Satoh | |
| 2014/0340605 A1* | 11/2014 | Takeda | G02F 1/134363 349/43 |
| 2015/0268504 A1* | 9/2015 | Kobayashi | G02F 1/13394 349/138 |
| 2015/0301372 A1* | 10/2015 | Mori | G02F 1/1345 349/33 |
| 2015/0346562 A1* | 12/2015 | Moriyama | G02F 1/1337 349/43 |
| 2017/0176820 A1* | 6/2017 | Nomura | G02F 1/134309 |
| 2018/0188614 A1* | 7/2018 | Yeh | G02F 1/1368 |
| 2020/0236259 A1* | 7/2020 | Nakamura | H01L 27/3234 |

FOREIGN PATENT DOCUMENTS

| | | | | |
|---|---|---|---|---|
| CN | 207424484 U | | 5/2018 | |
| CN | 108803173 A | | 11/2018 | |
| CN | 110047816 A | * | 7/2019 | ............ H01L 23/60 |
| CN | 111189618 A | * | 5/2020 | ........ G01M 11/0278 |
| CN | 111381410 A | | 7/2020 | |
| CN | 213210671 U | | 5/2021 | |
| JP | 2013064800 A | * | 4/2013 | |

* cited by examiner

DISPLAY DEVICE AND ARRAY SUBSTRATE

The present application is a U.S. National Stage Application of PCT/CN2021/112285, filed on Aug. 12, 2021, which claims priority of Chinese Patent Application No. 202011008217.9, filed on Sep. 23, 2020, both of which are incorporated herein by reference as part of the present application in their entireties.

TECHNICAL FIELD

At least one embodiment of the present disclosure relates to a display device and an array substrate.

BACKGROUND

Touch display products are very popular. The touch display products save space and are easy to carry, and have better human-computer interaction.

Since TDDI (Touch and Display Driver Integration) type touch display products were launched in 2015, the TDDI type touch display products have been widely favored by panel manufacturers due to their good performance, thin and light appearance, simplified supply chain and cost reduction. As consumers' requirements for screen-to-body ratio are getting higher and higher, the bezels of the TDDI type touch display products are getting narrower and narrower. Narrower bezels lead to thinner GND (ground) line widths, and thus many defects related to ESD (Electro-Static discharge) emerge. This causes a great challenge to the anti-ESD capability of the TDDI type touch display products.

SUMMARY

At least one embodiment of the disclosure provides a display device. The display device comprises an active display region and a frame region outside the active display region, and the display device comprises an array substrate and an opposite substrate provided opposite to each other. The array substrate comprises a substrate and a pixel electrode layer provided on the substrate, the pixel electrode layer comprises a plurality of active pixel electrodes located in the active display region; outermost active pixel electrodes of the plurality of active pixel electrodes comprise a first active pixel electrode, the first active pixel electrode comprises a first pixel electrode edge and a second pixel electrode edge arranged in a first direction and each extending in a second direction; in the first direction, the first pixel electrode edge is located between the second pixel electrode edge and the frame region, and the first direction and the second direction intersect each other. One of the array substrate and the opposite substrate comprises a common electrode layer; the common electrode layer comprises a first extended common electrode of block-shaped, an orthographic projection of the first extended common electrode on the substrate partially overlaps with an orthographic projection of the first active pixel electrode on the substrate; the first extended common electrode comprises a first extended portion extending beyond the first active pixel electrode, the first extended portion has a first extended portion edge extending in the second direction, the substrate has a first substrate edge extending in the second direction; and in the first direction, the first extended portion edge is located between the first substrate edge and the first pixel electrode edge.

For example, in the display device provided by at least one embodiment of the disclosure, in the first direction, a length of the first extended portion is greater than or equal to ⅓ of a length of the first active pixel electrode.

For example, in the display device provided by at least one embodiment of the disclosure, the frame region comprises a first frame region, a second frame region, a third frame region and a fourth frame region which are sequentially arranged in a clockwise direction; the array substrate has a protrusion portion beyond the opposite substrate, and the protrusion portion is located in the fourth frame region; and the first extended portion is located in at least one of the first frame region to the fourth frame region.

For example, in the display device provided by at least one embodiment of the disclosure, the first extended portion is located in the first frame region and/or the third frame region; and in the first direction, a ratio of a length of the first extended portion to a length of the first active pixel electrode is greater than or equal to 1.

For example, in the display device provided by at least one embodiment of the disclosure, the first extended portion is located in the second frame region and/or the fourth frame region; and in the first direction, a ratio of a length of the first extended portion to a length of the first active pixel electrode is greater than or equal to ⅓ and less than or equal to ½.

For example, in the display device provided by at least one embodiment of the disclosure, the pixel electrode layer further comprises a plurality of dummy pixel electrodes spaced apart from the plurality of active pixel electrodes, and the plurality of dummy pixel electrodes are located in the frame region.

For example, in the display device provided by at least one embodiment of the disclosure, the plurality of dummy pixel electrodes comprise a first dummy pixel electrode, and an orthographic projection of the first dummy pixel electrode on the substrate at least partially overlaps with an orthographic projection of the first extended portion on the substrate.

For example, in the display device provided by at least one embodiment of the disclosure, in the first direction, the first extended portion edge is located between the first dummy pixel electrode and the first substrate edge.

For example, in the display device provided by at least one embodiment of the disclosure, an edge of the first dummy pixel electrode closest to the first extended portion and extending in the second direction is a first dummy pixel electrode edge, and the first dummy pixel electrode edge comprises a first end portion and a second end portion; and in the first direction, a distance from the first end portion to the first extended portion edge is not equal to a distance from the second end portion to the first extended portion edge.

For example, in the display device provided by at least one embodiment of the disclosure, an edge of the first dummy pixel electrode closest to the first extended portion and extending in the second direction is a first dummy pixel electrode edge, the first dummy pixel electrode edge comprises a first end portion, a second end portion, and a connection line between the first end portion and the second end portion, and the connection line is parallel to the first extended portion edge.

For example, in the display device provided by at least one embodiment of the disclosure, the frame region further comprises a light-transmitting region, and at least a partial edge of the light-transmitting region is surrounded by the active display region; the plurality of active pixel electrodes comprise a plurality of second active pixel electrodes arranged closest to the light-transmitting region and along a circumferential direction of the light-transmitting region; each of the plurality of second active pixel electrodes comprises a third pixel electrode edge and a fourth pixel electrode edge arranged in the first direction and each extending in the second direction; and in the first direction, the third pixel electrode edge is located between the fourth pixel electrode edge and the light-transmitting region; the common electrode layer comprises a second extended common electrode, an orthographic projection of the second extended common electrode on the substrate partially overlaps with an orthographic projection of each of the plurality of second active pixel electrodes on the substrate; the second extended common electrode comprises a second extended portion extending beyond each of the plurality of second active pixel electrodes, and the second extended portion comprises a plurality of sub extended portions respectively corresponding to the plurality of second active pixel electrodes; and each of the plurality of sub extended portions has a first sub extended portion edge extending in the second direction; and in the first direction, the first sub extended portion edge is located between the light-transmitting region and the third pixel electrode edge.

For example, in the display device provided by at least one embodiment of the disclosure, extension directions of first sub extended portion edges of two of the plurality of sub extended portions provided adjacently along the circumferential direction of the light-transmitting region are different from each other.

For example, in the display device provided by at least one embodiment of the disclosure, in the second direction, first sub extended portion edges of at least two of the plurality of sub extended portions are arranged in a staggered manner in the first direction.

For example, in the display device provided by at least one embodiment of the disclosure, the plurality of dummy pixel electrodes further comprise a plurality of second dummy pixel electrodes located between the plurality of second active pixel electrodes and the light-transmitting region in the first direction; and orthographic projections of the plurality of second dummy pixel electrodes on the substrate at least partially overlap with orthographic projections of the plurality of sub extended portions of the second extended portion on the substrate.

For example, in the display device provided by at least one embodiment of the disclosure, first sub extended portion edges of the plurality of sub extended portions are located between the plurality of second dummy pixel electrodes and the light-transmitting region.

For example, in the display device provided by at least one embodiment of the disclosure, the array substrate further comprises a plurality of switching elements on the substrate and spaced apart from each other, the plurality of switching elements comprise a plurality of first switching elements, and the plurality of first switching elements are electrically connected to the plurality of active pixel electrodes, respectively.

For example, in the display device provided by at least one embodiment of the disclosure, the plurality of switching elements further comprise a plurality of second switching elements, and orthographic projections of the plurality of second switching elements on the substrate at least partially overlap with orthographic projections of the plurality of dummy pixel electrodes on the substrate, respectively.

For example, in the display device provided by at least one embodiment of the disclosure, the common electrode layer comprises a plurality of sub common electrodes spaced apart from each other, the plurality of sub common electrodes are multiplexed as touch electrodes, and the first extended common electrode and the second extended common electrode are one of the plurality of sub common electrodes, respectively.

For example, in the display device provided by at least one embodiment of the disclosure, each of the first extended common electrode and the second extended common electrode is an integral structure.

For example, in the display device provided by at least one embodiment of the disclosure, an absolute value of a working voltage of each of the first extended common electrode and the second extended common electrode is less than or equal to 0.2V.

For example, in the display device provided by at least one embodiment of the disclosure, a ratio of an area of the first extended portion to an area of the first extended common electrode is not greater than 1%.

For example, the display device provided by at least one embodiment of the disclosure further comprises a ground line surrounding the active display region, and a line width of the ground line is less than or equal to 50 microns.

For example, in the display device provided by at least one embodiment of the disclosure, one of the array substrate and the opposite substrate comprises a black matrix layer, and the black matrix layer blocks the first extended portion of the first extended common electrode and the second extended portion of the second extended common electrode.

For example, the display device provided by at least one embodiment of the disclosure further comprises an annular sealant connecting the array substrate and the opposite substrate, and the black matrix layer has an annular groove at the sealant.

For example, in the display device provided by at least one embodiment of the disclosure, the groove is filled with a filter material.

At least one embodiment of the disclosure provides an array substrate. The array substrate comprises an active display region and a frame region outside the active display region. The array substrate comprises a substrate and a pixel electrode layer provided on the substrate, the pixel electrode layer comprises a plurality of active pixel electrodes located in the active display region; outermost active pixel electrodes of the plurality of active pixel electrodes comprise a first active pixel electrode, the first active pixel electrode comprises a first pixel electrode edge and a second pixel electrode edge arranged in a first direction and each extending in a second direction; and in the first direction, the first pixel electrode edge is located between the second pixel electrode edge and the frame region, and the first direction and the second direction intersect each other. The array substrate comprises a common electrode layer, the common electrode layer comprises a first extended common electrode of block-shaped; an orthographic projection of the first extended common electrode on the substrate partially overlaps with an orthographic projection of the first active pixel electrode on the substrate; the first extended common electrode comprises a first extended portion extending beyond the first active pixel electrode, the first extended portion has a first extended portion edge extending in the second direction, the substrate has a first substrate edge extending in the second direction; and in the first direction, the first extended portion edge is located between the first substrate edge and the first pixel electrode edge.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
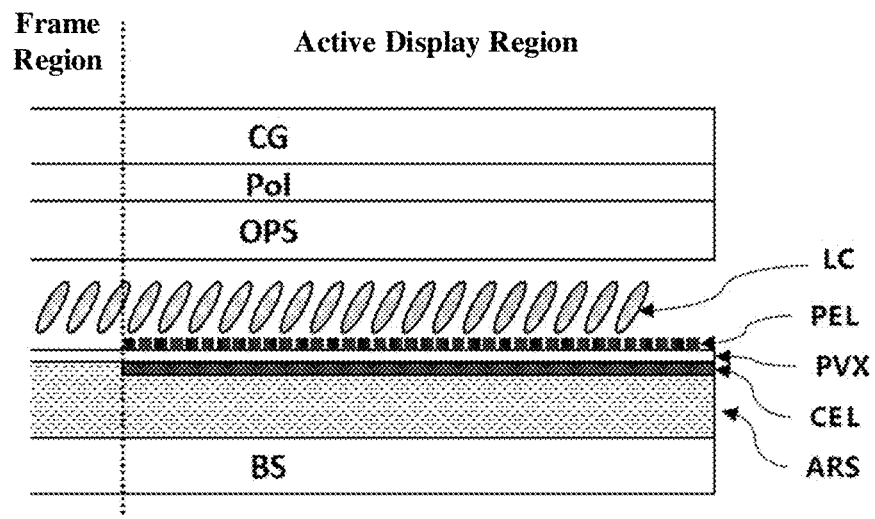
FIG. 1 is a schematic partial cross-sectional view of a display device.

FIG. 1 is a schematic partial cross-sectional view of a display device. As shown in FIG. 1, the display device has an active display region and a frame region, and includes an array substrate ARS and an opposite substrate OPS provided opposite to each other, and a liquid crystal LC located between the array substrate ARS and the opposite substrate OPS. One of the opposite substrate OPS and the array substrate ARS includes a black matrix layer. The array substrate ARS includes a substrate BS, a common electrode layer CEL and a pixel electrode layer PEL located on a side of the substrate BS facing the liquid crystal LC, and a passivation insulating layer PVX separating the common electrode layer CEL from the pixel electrode layer PEL, and the common electrode layer CEL and the pixel electrode layer PEL are both located in the active display region.

The inventors of the present application noticed during research that during a film tearing/ESD (Electro-Static Discharge) test of the display device shown in FIG. 1, bright lines may appear on the side where a gate driving circuit of the display device is located. The inventors of the present application noticed that the reasons for the appearance of bright lines are as follows: at the moment of tearing off a film or when hitting the screen of the display device with an electrostatic gun in the ESD test, static electricity spreads from the center of the screen of the display device to the periphery on a cover plate CG, a polarizer Pol, the black matrix layer and the array substrate ARS and accumulates in the periphery; in the case where the electrostatic discharge capability of the display device is relatively weak (for example, in the case where the resistance of the polarizer Pol and the black matrix layer is relatively large and a ground line is relatively narrow), the electrostatic electric field formed by the static electricity accumulated at periphery of each layer in the display device affects the deflection of the edge portion of the liquid crystal LC; and the common electrode layer CEL is sensitive to the interference of the electrostatic electric field due to its own small voltage (e.g., voltage ≤±0.2V), so the electrostatic accumulation at the edge of the common electrode layer CEL will aggravate the appearance of bright lines.

The embodiments of the present disclosure provide a display device and an array substrate. The display device comprises an active display region and a frame region outside the active display region, and the display device includes an array substrate and an opposite substrate provided opposite to each other. The array substrate includes a substrate and a pixel electrode layer provided on the substrate, the pixel electrode layer includes a plurality of active pixel electrodes located in the active display region; outermost active pixel electrodes of the plurality of active pixel electrodes include a first active pixel electrode, the first active pixel electrode includes a first pixel electrode edge and a second pixel electrode edge arranged in a first direction and each extending in a second direction different from the first direction; and in the first direction, the first pixel electrode edge is located between the second pixel electrode edge and a portion of the frame region closest to the first pixel electrode edge. One of the array substrate and the opposite substrate includes a common electrode layer; the common electrode layer includes a first extended common electrode of block-shaped, an orthographic projection of the first extended common electrode on the substrate partially overlaps with an orthographic projection of the first active pixel electrode on the substrate; the first extended common electrode includes a first extended portion extending beyond the first active pixel electrode, the first extended portion has a first extended portion edge extending in the second direction, the substrate has a first substrate edge extending in the second direction; and in the first direction, the first extended portion edge is located between the first substrate edge and the first pixel electrode edge. By extending the common electrode layer outside the active display region (that is, the common electrode layer extends into the frame region), the defective bright lines that occur on the screen of the display device during the film tearing/ESD test can be reduced or eliminated.

Figure 2:
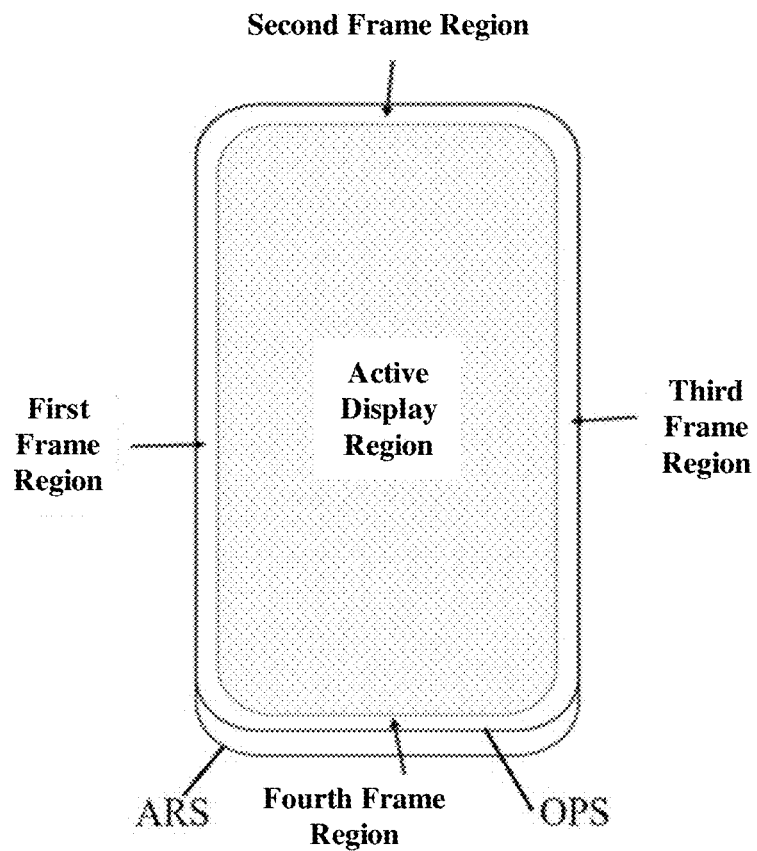
FIG. 2 is a schematic top view of a display device provided by at least one embodiment of the present disclosure.

FIG. 2 is a schematic top view of the display device provided by at least one embodiment of the present disclosure. As shown in FIG. 2, the display device provided by at least one embodiment of the present disclosure has an active display region and a frame region outside the active display region. In some embodiments, the planar structure of the display device is a quadrilateral structure. For example, as shown in FIG. 2, the frame region of the display device includes a first frame region, a second frame region, a third frame region and a fourth frame region which are sequentially arranged in a clockwise direction. The first frame region is opposite to the third frame region, and the second frame region is opposite to the fourth frame region. The display device further includes an array substrate ARS and an opposite substrate OPS provided opposite to each other, the array substrate ARS has a protrusion portion beyond the opposite substrate OPS, and the protrusion portion is located in the fourth frame region. In other embodiments, the planar structure of the display device is a polygonal structure or a non-polygonal structure. In some embodiments, at least one of the first frame region and the third frame region is provided with a gate driving circuit electrically connected to gate lines, the fourth frame region is provided with a data driving circuit electrically connected to data lines, and the fourth frame region is further provided with other functional structure such as a flexible printed circuit board and the like.

In the embodiments of the present disclosure, the above-mentioned first extended common electrode extends into at least one of the first frame region to the fourth frame region.

Figure 3A:
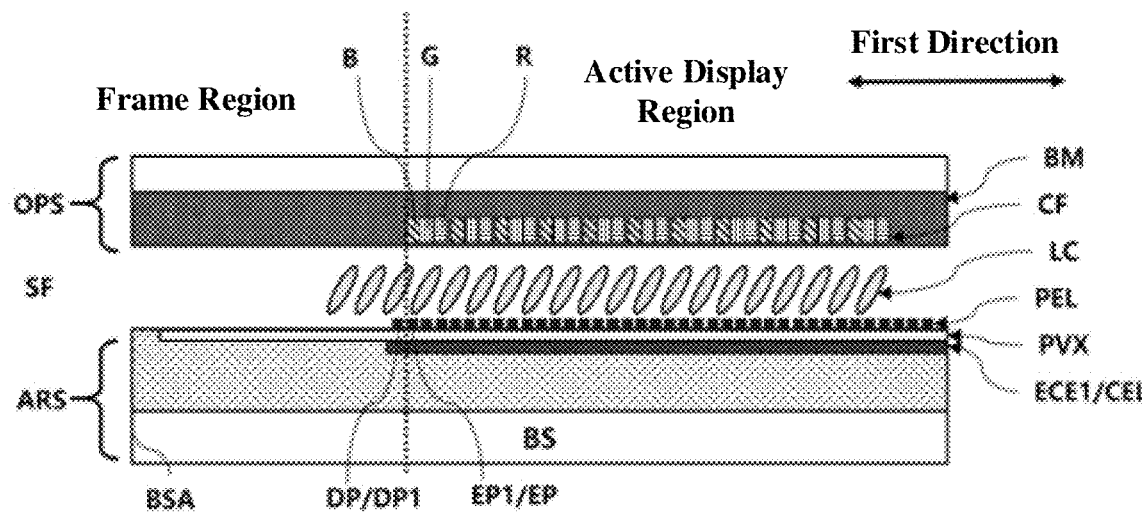
FIG. 3A is a schematic cross-sectional view of a partial structure in the display device provided by at least one embodiment of the present disclosure.
Figure 3B:
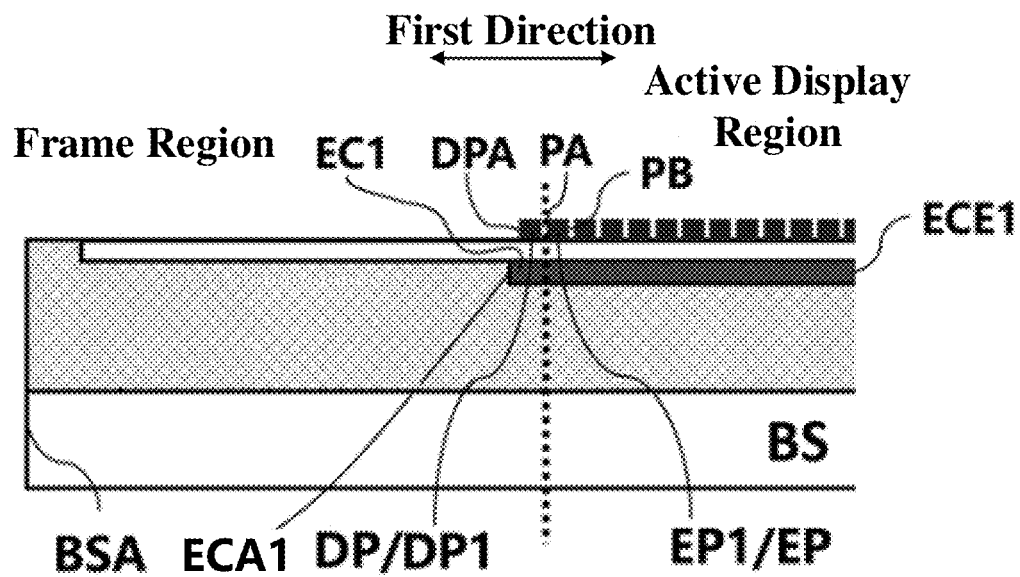
FIG. 3B is a schematic partial enlarged view of FIG. 3A.
Figure 4A:
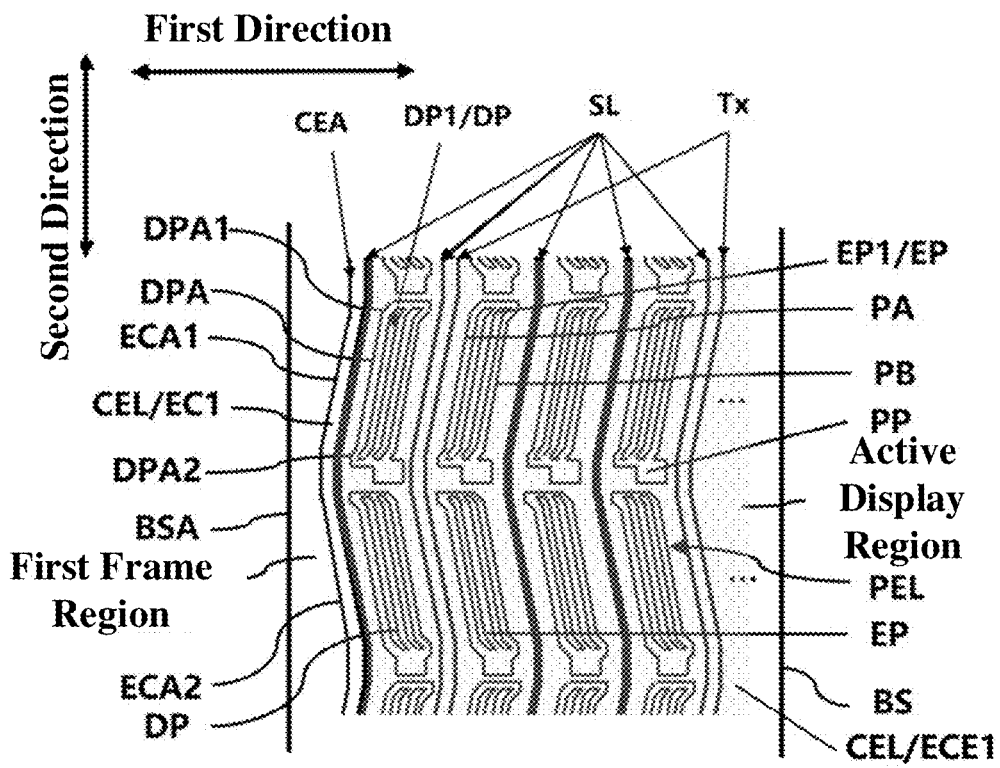
FIG. 4A is a schematic top view of the display device provided by at least one embodiment of the present disclosure in the case where a first extended common electrode extends into a first frame region.
Figure 4B:
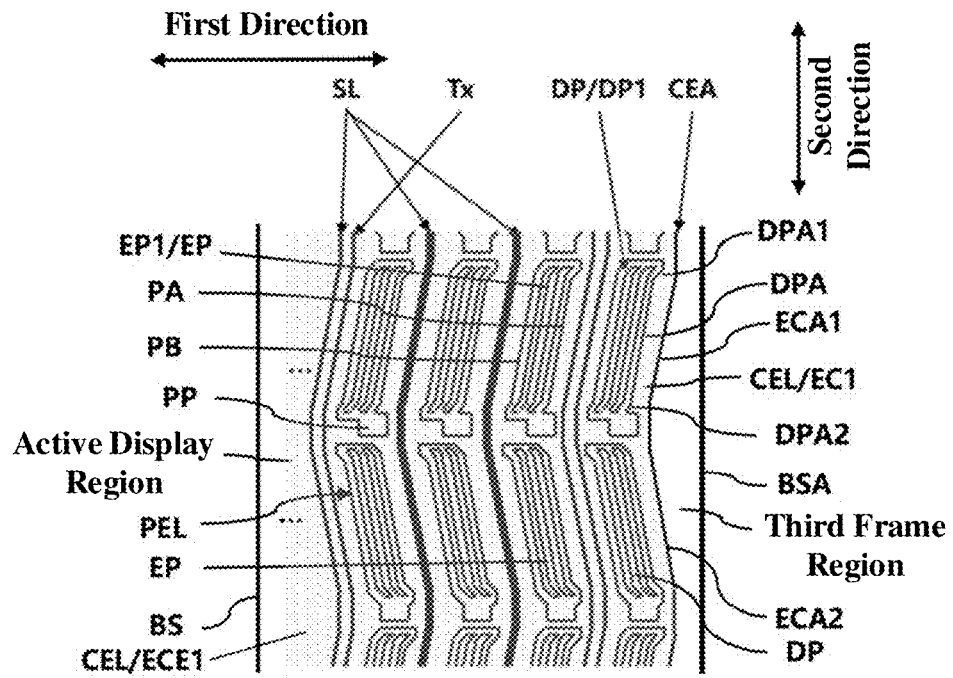
FIG. 4B is a schematic top view of the display device provided by at least one embodiment of the present disclosure in the case where the first extended common electrode extends into a third frame region.
Figure 4C:
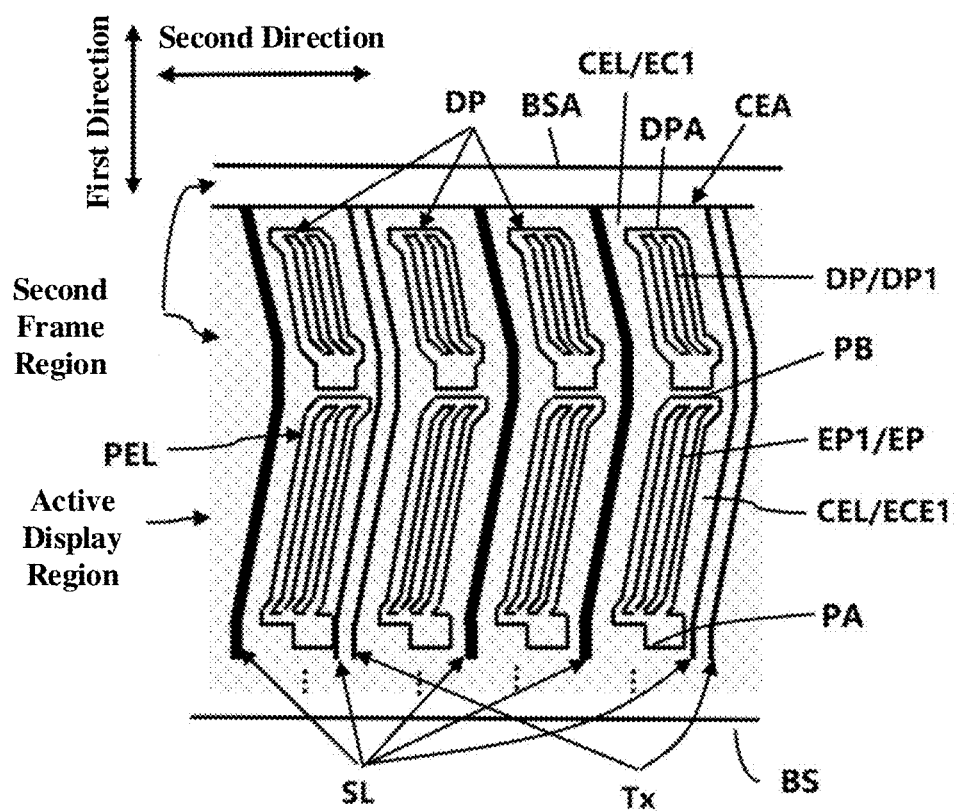
FIG. 4C is a schematic top view of the display device provided by at least one embodiment of the present disclosure in the case where the first extended common electrode extends into a second frame region.
Figure 4D:
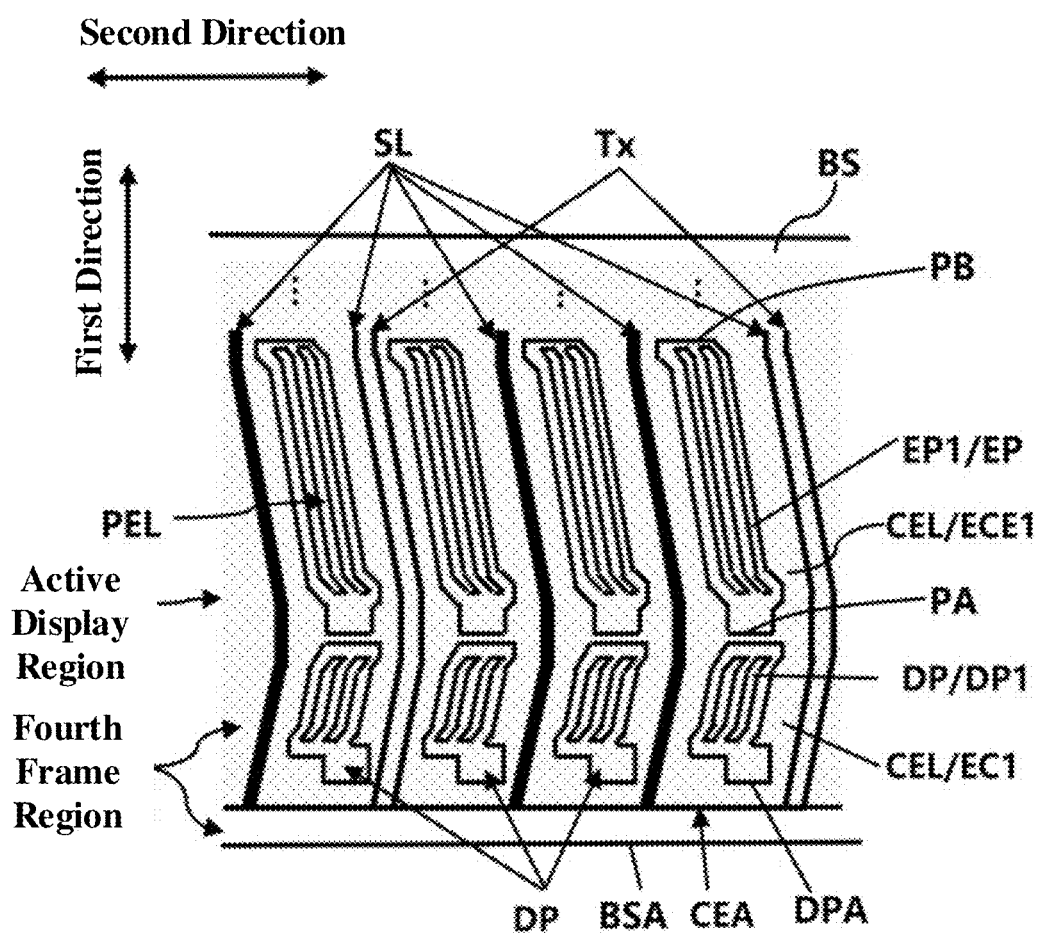
FIG. 4D is a schematic top view of the display device provided by at least one embodiment of the present disclosure in the case where the first extended common electrode extends into a fourth frame region.

FIG. 3A is a schematic cross-sectional view of a partial structure in the display device provided by at least one embodiment of the present disclosure. FIG. 3B is a schematic partial enlarged view of FIG. 3A. FIG. 4A is a schematic top view of the display device provided by at least one embodiment of the present disclosure in the case where the first extended common electrode extends into the first frame region. FIG. 4B is a schematic top view of the display device provided by at least one embodiment of the present disclosure in the case where the first extended common electrode extends into the third frame region. FIG. 4C is a schematic top view of the display device provided by at least one embodiment of the present disclosure in the case where the first extended common electrode extends into the second frame region. FIG. 4D is a schematic top view of the display device provided by at least one embodiment of the present disclosure in the case where the first extended common electrode extends into the fourth frame region.

As shown in FIG. 3A and FIG. 4A-FIG. 4D, the display device includes a plurality of sub-pixel regions (each sub-pixel region is a region surrounded by gate lines adjacent to each other and data lines adjacent to each other) defined by the intersection of a plurality of data lines SL and a plurality of gate lines (not shown in the figure). For example, the plurality of sub-pixel regions include a plurality of red sub-pixel regions, a plurality of green sub-pixel regions and a plurality of blue sub-pixel regions. In some embodiments, as shown in FIG. 3A, the display device further includes a color filter layer CF, and the color filter layer CF includes red filter patterns R respectively located in the plurality of red sub-pixel regions, green filter patterns G respectively located in the plurality of green sub-pixel regions, and blue filter patterns B respectively located in the plurality of blue sub-pixel regions. In some embodiments, the opposite substrate OPS includes the color filter layer CF, as shown in FIG. 3A. In other embodiments, the array substrate ARS includes the color filter layer CF.

In some embodiments, as shown in FIG. 3A, the display device further includes a black matrix layer BM. Each sub-pixel region includes an opening region and a non-opening region surrounding the opening region, the non-opening region is a region of the sub-pixel region that is blocked by the black matrix layer BM, and the opening region is a region of the sub-pixel region that is not blocked by the black matrix layer BM. The active display region includes opening regions and non-opening regions of the plurality of sub-pixel regions. In some embodiments, the opposite substrate OPS includes the black matrix layer BM, as shown in FIG. 3A. In other embodiments, the array substrate ARS includes the black matrix layer BM.

As shown in FIG. 3A and FIG. 3B, the display device includes an array substrate ARS and an opposite substrate OPS provided opposite to each other. The array substrate ARS includes a substrate BS and a pixel electrode layer PEL located on the substrate BS. The pixel electrode layer PEL includes a plurality of active pixel electrodes EP located in the active display region. For example, each active pixel electrode EP is located in one sub-pixel region, and each sub-pixel region is provided with one active pixel electrode EP, that is, the active pixel electrodes EP are in one-to-one correspondence with the sub-pixel regions. As shown in FIG. 3A to FIG. 4D, outermost active pixel electrodes of the plurality of active pixel electrodes EP include a first active pixel electrode EP1, and the first active pixel electrode EP1 includes a first pixel electrode edge PA and a second pixel electrode edge PB arranged in a first direction and each extending in a second direction different from the first direction. The first pixel electrode edge PA and the second pixel electrode edge PB are edges included in the first active pixel electrode EP1 that are farthest apart from each other in the first direction; and in the first direction, the first pixel electrode edge PA is located between the second pixel electrode edge PB and a portion of the frame region closest to the first pixel electrode edge PA. It should be noted that the outermost active pixel electrodes refer to active pixel electrodes adjacent to the frame region among the plurality of active pixel electrodes EP. Taking the plurality of active pixel electrodes EP arranged in rows and columns as an example, the outermost active pixel electrodes among the plurality of active pixel electrodes EP are active pixel electrodes in the first row, the last row, the first column and the last column.

One of the array substrate ARS and the opposite substrate OPS includes a common electrode layer CEL. In the embodiment shown in FIG. 3A and FIG. 3B, the array substrate ARS includes the common electrode layer CEL on the substrate BS, and the common electrode layer CEL is separated from the pixel electrode layer PEL by the passivation insulating layer PVX. In some embodiments, as shown in FIG. 3A and FIG. 3B, the common electrode layer CEL is located between the substrate BS and the pixel electrode layer PEL, in which case each active pixel electrode EP includes a plurality of strip electrodes spaced apart from each other and connected with each other in parallel. In other embodiments, the pixel electrode layer PEL is located between the substrate BS and the common electrode layer CEL, in which case the common electrode layer CEL includes a plurality of strip electrodes spaced apart from each other and connected with each other in parallel.

As shown in FIG. 3A to FIG. 4D, the common electrode layer CEL includes a first extended common electrode ECE1 of block-shaped, the orthographic projection of the first extended common electrode ECE1 on the substrate BS partially overlaps with the orthographic projection of the first active pixel electrode EP1 on the substrate BS, that is, the first extended common electrode ECE1 includes a portion that overlaps with the first active pixel electrode EP1 and includes a portion that does not overlap with the first active pixel electrode EP1. It should be noted that the "block-shaped" first extended common electrode ECE1 means that the first extended common electrode ECE1 is not linear, and in this case, the first pixel electrode edge PA and the second pixel electrode edge PB of the first active pixel electrode EP1 are located between two edges of the first extended common electrode ECE1 each extending in the second direction and farthest apart from each other in the first direction. In some embodiments, the first extended common electrode ECE1 overlaps with a plurality of active pixel electrodes EP arranged in sequence along the first direction and overlaps with a plurality of active pixel electrodes EP arranged in sequence along the second direction. For example, as shown in FIG. 3A to FIG. 4D, the orthographic projection of the first extended common electrode ECE1 on the substrate BS further overlaps with the orthographic projection of the active pixel electrode EP adjacent to the first active pixel electrode EP1 in the first direction on the substrate BS. Furthermore, as shown in FIG. 4A to FIG. 4D, the orthographic projection of the first extended common electrode ECE1 on the substrate BS further overlaps with the orthographic projection of the active pixel electrode EP adjacent to the first active pixel electrode EP1 in the second direction on the substrate BS. In some embodiments, the first extended common electrode ECE1 includes a plurality of common electrode strips directly connected to each other, that is, a strip-shaped opening is formed between adjacent common electrode strips, and the strip-shaped opening penetrates through the first extended common electrode ECE1 in the thickness direction of the first extended common electrode ECE1. In other embodiments, the first extended common electrode ECE1 is a plate-shaped structure without the above-mentioned plurality of common electrode strips, as shown in FIG. 4A to FIG. 4D, in this case, the orthographic projection of a portion, which is in the opening region of the sub-pixel region, of the entire first active pixel electrode EP1 on the substrate BS is within the orthographic projection of the first extended common electrode ECE1 on the substrate BS.

As shown in FIG. 3A to FIG. 4D, the first extended common electrode ECE1 includes a first extended portion EC1 extending beyond the first active pixel electrode EP1, and the first extended portion EC1 has a first extended portion edge CEA extending in the second direction. The edge of the substrate BS that is closest to the first extended portion edge CEA and extends in the second direction is a first substrate edge BSA; and in the first direction, the first extended portion edge CEA is located between the first substrate edge BSA and the first pixel electrode edge PA. That is, in the first direction, the orthographic projection of the first extended portion edge CEA on the substrate BS is located between the orthographic projection of the first pixel electrode edge PA on the substrate BS and the first substrate edge BSA. In this case, the first extended portion edge CEA is located outside the active display region, that is, the first extended portion edge CEA is located in the portion of the frame region that is closest to the first pixel electrode edge PA.

In the embodiments of the present disclosure, by extending the first extended common electrode ECE1 from a position overlapping with the first active pixel electrode EP1 into the frame region (that is, extending to the outside of the active display region), the edge of electrostatic accumulation is extended outward from the active display region shown in FIG. 1 to the outside of the active display region, thereby effectively reducing or eliminating the defective bright lines that occur on the screen of the display device.

In some embodiments, the display device includes a plurality of first active pixel electrodes EP1 and a plurality of first extended common electrodes ECE1. In some embodiments, the plurality of first active pixel electrodes EP1 and the plurality of first extended common electrodes ECE1 correspond to the same frame region among the first frame region to the fourth frame region. In other embodiments, the plurality of first active pixel electrodes EP1 respectively correspond to different frame regions, and the plurality of first extended common electrodes ECE1 respectively extend into different frame regions. For example, in the case where the first frame region and the third frame region are sequentially arranged in the first direction, as shown in FIG. 4A and FIG. 4B, some first active pixel electrodes EP1 and some first extended common electrodes ECE1 correspond to the first frame region, and another some first active pixel electrodes EP1 and another some first extended common electrodes ECE1 correspond to the third frame region; or, in the case where the second frame region and the fourth frame region are sequentially arranged in the first direction, as shown in FIG. 4C and FIG. 4D, some first active pixel electrodes EP1 and some first extended common electrodes ECE1 correspond to the second frame region, and another some first active pixel electrodes EP1 and another some first extended common electrodes ECE1 correspond the fourth frame region.

In at least one embodiment, the absolute value of a working voltage of the first extended common electrode ECE1 is less than or equal to 0.2V. In this way, vertical block defects caused by an excessively large voltage difference between the first extended common electrode ECE1 and the active pixel electrode EP can be avoided.

In at least one embodiment, the first extended common electrode ECE1 is multiplexed as a touch electrode. In this case, the display device provided by at least one embodiment of the present disclosure is an in-cell touch display device (e.g., a TDDI type touch display device), so that the display device has a high level of integration.

Figure 5:
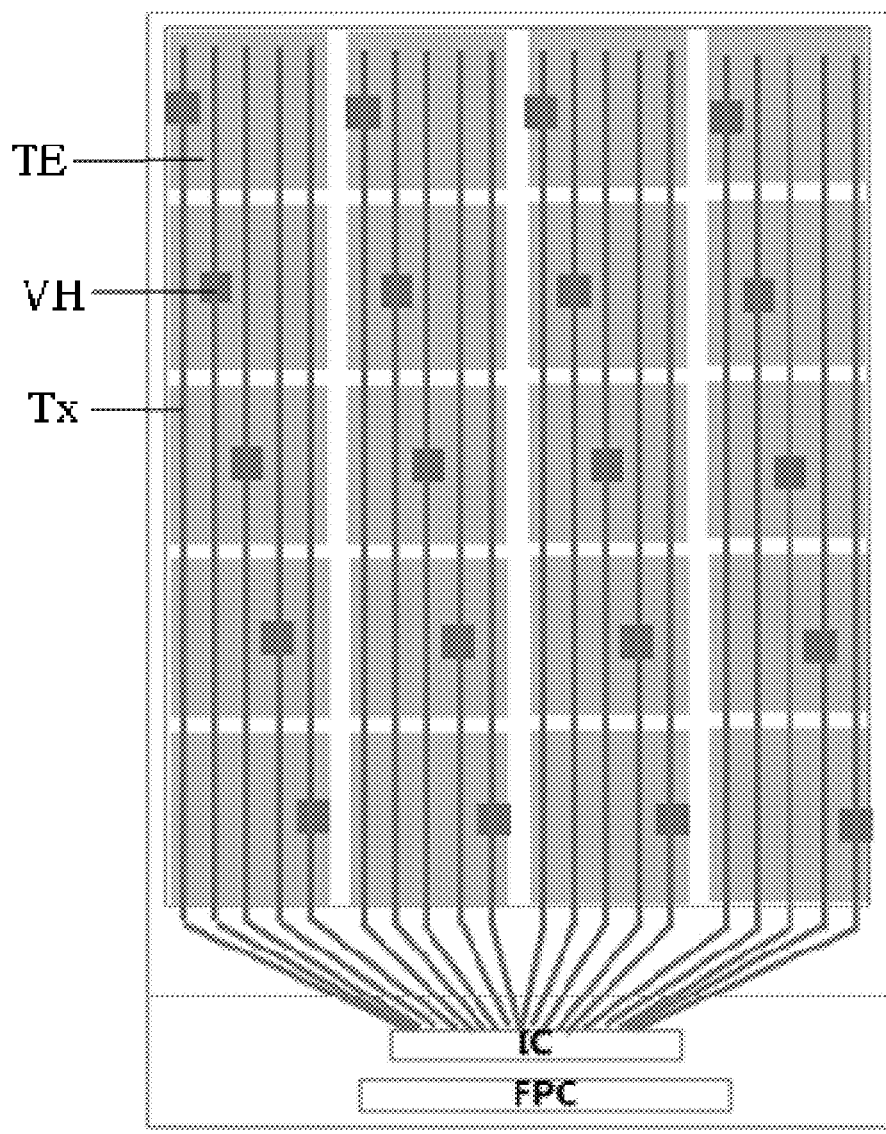
FIG. 5 is a schematic view of a connection relationship between touch electrodes and touch signal lines in the display device provided by at least one embodiment of the present disclosure.

FIG. 5 is a schematic view of a connection relationship between touch electrodes and touch signal lines in the display device provided by at least one embodiment of the present disclosure.

For example, as shown in FIG. 5, the common electrode layer includes a plurality of sub common electrodes TE spaced apart from each other, the plurality of sub common electrodes TE are multiplexed as touch electrodes, and the first extended common electrode ECE1 is one of the outermost sub common electrodes among the plurality of sub common electrodes TE. For example, the plurality of sub common electrodes TE are arranged in rows and columns, and the outermost sub common electrodes among the plurality of sub common electrodes TE are sub common electrodes TE in the first row, the last row, the first column and the last column. As shown in FIG. 5, the display device further includes a plurality of touch signal lines Tx and a touch control circuit IC, and each touch electrode TE is electrically connected to a corresponding touch signal line Tx through a via hole VH, so as to be electrically connected to the touch control circuit IC through the touch signal line Tx. In at least one embodiment, a time-division driving method is adopted, that is: in a display stage, the sub common electrode TE is applied with a common voltage to realize a display function; and in a touch stage, the sub common electrode TE is applied with a touch signal to realize a touch function. For example, the touch signal line Tx is multiplexed as a common electrode signal line to provide a signal to the sub common electrode TE in the display stage. For example, the display device further includes a flexible printed circuit board FPC, which is located on the side of the touch control circuit IC away from the sub common electrode TE.

In some embodiments, as shown in FIG. 4A to FIG. 4D, the touch signal line Tx is located between adjacent subpixel regions to avoid affecting the aperture ratio of the display device. For example, the plurality of sub-pixel regions in the display device are divided into a plurality of pixel regions, and each pixel region includes three sub-pixel regions. In this case, for example, one touch signal line Tx is provided between two adjacent pixel regions, and there is only one column of pixel regions between two adjacent touch signal lines Tx, as shown in FIG. 4A to FIG. 4D. In some embodiments, as shown in FIG. 4A to FIG. 4D, the first extended common electrode ECE1 overlaps with a plurality of touch signal lines Tx, that is, a plurality of touch signal lines Tx are provided in the region where the first extended common electrode ECE1 is located. Some of the plurality of touch signal lines Tx (for example, one touch signal line Tx) are electrically connected to the first extended common electrode ECE1, and another some of the plurality of touch signal lines Tx are not electrically connected to the first extended common electrode ECE1. The arrangement of the touch signal lines Tx includes but is not limited to the arrangements shown in FIG. 4A to FIG. 4D.

In at least one embodiment, each sub common electrode TE is an integral structure, and correspondingly, the first extended common electrode ECE1 is an integral structure.

In at least one embodiment, the absolute value of a working voltage of each sub common electrode TE is less than or equal to 0.2V. In this way, vertical block defects caused by an excessively large voltage difference between the sub common electrode TE and the active pixel electrode EP can be avoided.

In at least one embodiment of the present disclosure, because the first extended common electrode ECE1 is extended into the frame region, the area of the first extended common electrode ECE1 is larger than the area of the sub common electrode TE that is not extended among the above-mentioned plurality of sub common electrodes TE (The areas of the sub common electrodes TE that are not extended are approximately the same, and "approximately" refers to ignoring the influence of manufacturing process errors). In order to avoid affecting the touch effect, in at least one embodiment, the ratio of the area of the first extended portion EC1 to the area of the first extended common electrode ECE1 is not greater than 1%. In the embodiments of the present disclosure, by allowing the first extended portion EC1 occupy only a small part of the first extended common electrode ECE1, the defective bright lines in the display device are effectively reduced or eliminated while taking into account the touch effect.

In at least one embodiment, in the first direction, the length of the first extended portion EC1 is greater than or equal to ⅓ of the length of the first active pixel electrode EP1. For example, the length of the first extended portion EC1 in the first direction is greater than or equal to ⅓ of the length of the sub-pixel region where the first active pixel electrode EP1 is located in the first direction. In this way, it can be ensured that the first extended portion edge CEA is far away from the active display region, thereby effectively reducing or eliminating the defective bright lines that occur on the screen of the display device. It should be noted that the length of the first active pixel electrode EP1 is the distance between the first pixel electrode edge PA and the second pixel electrode edge PB of the first active pixel electrode EP1 in the first direction.

The length of the first extended portion EC1 in the first direction for example is adjusted according to the frame region where the first extended portion EC1 is located.

For example, in the case where the first extended portion EC1 is located in the first frame region (as shown in FIG. 4A) or the third frame region (as shown in FIG. 4B), in the first direction, the ratio of the length of the first extended portion EC1 to the length of the first active pixel electrode EP1 is greater than or equal to 1. The length of the first active pixel electrode EP1 in the first direction is the distance between the first pixel electrode edge PA and the second pixel electrode edge PB of the first active pixel electrode EP1 in the first direction. For example, in the first direction, the ratio of the length of the first extended portion EC1 to the length of the first active pixel electrode EP1 is less than or equal to 2. For example, in the case where the first extended portion EC1 is located in the first frame region (as shown in FIG. 4A) or the third frame region (as shown in FIG. 4B), in the first direction, the ratio of the length of the first extended portion EC1 to the length of the sub-pixel region where the first active pixel electrode EP1 is located (i.e., the distance of two adjacent data lines SL defining the sub-pixel region in the first direction) is greater than or equal to 1. For example, in the first direction, the ratio of the length of the first extended portion EC1 to the length of the sub-pixel region where the first active pixel electrode EP1 is located is less than or equal to 2.

For example, in the case where the first extended portion EC1 is located in the second frame region (as shown in FIG. 4C) or the fourth frame region (as shown in FIG. 4D), in the first direction, the ratio of the length of the first extended portion EC1 to the length of the first active pixel electrode EP1 in the first direction is greater than or equal to ⅓ and less than or equal to ½. For example, in the first direction, the ratio of the length of the first extended portion EC1 to the length of the sub-pixel region where the first active pixel electrode EP1 is located (i.e., the distance of two adjacent gate lines defining the sub-pixel region in the first direction) is greater than or equal to ⅓ and less than or equal to ½. The length of the first extended portion EC1 in the first direction should not be too small to ensure that the first extended portion edge CEA is far away from the active display region, thereby effectively reducing or eliminating the defective bright lines that occur on the screen of the display device. In addition, the length of the first extended portion EC1 in the first direction should not be too large to avoid increasing the width of the frame region.

It should be noted that, in some embodiments, as shown in FIG. 4A to FIG. 4D, the first pixel electrode edge PA of the first active pixel electrode EP1 is not linear, and the first extended common electrode ECE1 includes the part provided between the adjacent active pixel electrodes EP in the second direction. In this case, the length of the first extended portion EC1 in the first direction refers to the maximum length of a portion of the first extended portion EC1 facing the first pixel electrode edge PA in the first direction, that is, the maximum distance between a portion of the first extended portion edge CEA facing the first pixel electrode edge PA and the first pixel electrode edge PA in the first direction (i.e., the distance between the orthographic projections in the first direction).

In some embodiments, as shown in FIG. 4A to FIG. 4D, the active pixel electrode EP includes a plurality of strip electrodes that are spaced apart from each other and connected with each other in parallel, and the strip electrodes of the active pixel electrodes EP in two adjacent rows have opposite tilt directions. For example, as shown in FIG. 4A and FIG. 4B, the strip electrodes of the active pixel electrodes EP in the first row are tilted to the right, and the strip electrodes of the active pixel electrodes EP in the second row are tilted to the left.

In the case where the first extended common electrode ECE1 extends into different frame regions, the first extended portion edge CEA of the first extended common electrode ECE1 has different shapes.

For example, in the case where the first extended portion EC1 is located in the first frame region (as shown in FIG. 4A) or the third frame region (as shown in FIG. 4B), the first extended portion edge CEA of the first extended common electrode ECE1 has a first edge segment ECA1 and a second edge segment ECA2 whose extension directions intersect, the tilt direction of the first edge segment ECA1 is consistent with the tilt direction of the strip electrodes of the active pixel electrodes EP in the first row, and the tilt direction of the second edge segment ECA2 is consistent with the tilt direction of the strip electrodes of the active pixel electrodes EP in the second row. For example, as shown in FIG. 4A, the first edge segment ECA1 and the second edge segment ECA2 of the first extended portion edge CEA form a first bend portion, and a bend position of the first bend portion (the middle part of the first bend portion) is closer to the first substrate edge BSA than the rest of the first bend portion. For example, as shown in FIG. 4B, the first edge segment ECA1 and the second edge segment ECA2 of the first extended portion edge CEA form a second bend portion, and a bend position of the second bend portion (the middle part of the second bend portion) is further from the first substrate edge BSA than the rest of the second bend portion. For example, in the case where a part of the plurality of first extended common electrodes ECE1 extend into the first frame region (as shown in FIG. 4A) and another part of the plurality of first extended common electrodes ECE1 extend into the third frame region (as shown in FIG. 4B), for the first extended common electrode ECE1 extending into the first frame region and the first extended common electrode ECE1 extending into the third frame region which both are adjacent to the active pixel electrodes EP of the same row, the portions of the first extended portion edges CEA of the two first extended common electrodes ECE1 facing the active pixel electrodes EP of the same row have the same tilt direction.

For example, in the case where the first extended portion EC1 is located in the second frame region (as shown in FIG. 4C) or the fourth frame region (as shown in FIG. 4D), the first extended portion edge CEA is linear. In addition, in the first direction, the distance from the first extended portion edge CEA, which is located in the second frame region, to the first active pixel electrode EP1 is greater than the distance from the first extended portion edge CEA, which is located in the fourth frame region, to the first active pixel electrode EP1. That is, in the first direction, the distance from the first extended portion edge CEA, which is located in the second frame region, to the first pixel electrode edge PA of the first active pixel electrode EP1 is greater than the distance from the first extended portion edge CEA, which is located in the fourth frame region, to the first pixel electrode edge PA of the first active pixel electrode EP1.

In some embodiments, as shown in FIG. 3A to FIG. 4D, the pixel electrode layer PEL further includes a plurality of dummy pixel electrodes DP spaced apart from the plurality of active pixel electrodes EP (only one dummy pixel electrode is shown in FIG. 3A and FIG. 3B), and the plurality of dummy pixel electrodes DP are located in the frame region. That is, the active pixel electrode EP is the pixel electrode located in the active display region, and the dummy pixel electrode DP is the pixel electrode located in the frame region.

In the embodiments of the present disclosure, the array substrate ARS further includes a plurality of switching elements located on the substrate BS, and the plurality of switching elements are respectively located in the plurality of sub-pixel regions to be electrically connected with the active pixel electrodes EP in the plurality of sub-pixel regions, respectively. For example, the switching element is a thin film transistor, the thin film transistor includes a gate electrode, an active layer, and a source electrode and a drain electrode electrically connected to the active layer, the gate electrode is electrically connected (e.g., directly connected) to the gate line, and the source electrode is electrically connected (e.g., directly connected) to the data line SL.

Figure 6A:
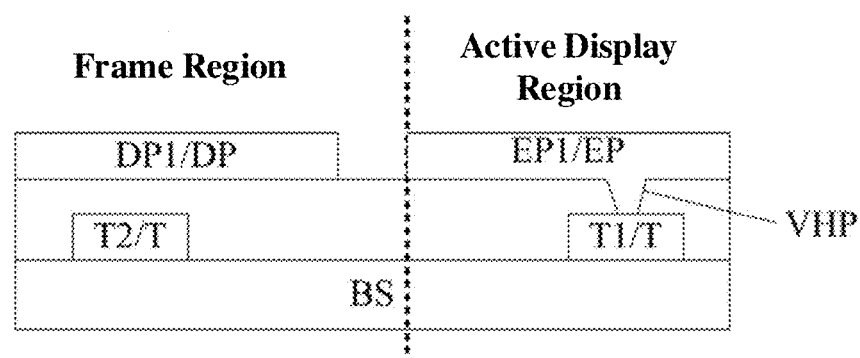
FIG. 6A is a schematic view of a connection relationship between a plurality of switching elements and active pixel electrodes as well as dummy pixel electrodes in the display device provided by at least one embodiment of the present disclosure.

FIG. 6A is a schematic view of a connection relationship between the plurality of switching elements and the active pixel electrodes as well as the dummy pixel electrodes in the display device provided by at least one embodiment of the present disclosure. For example, as shown in FIG. 6A, the array substrate ARS further includes a plurality of switching elements T on the substrate BS and spaced apart from each other. The plurality of switching elements T include a plurality of first switching elements T1 (only one first switching element T1 is shown in FIG. 6A for illustration), and the plurality of first switching elements T1 are electrically connected (for example, through via holes VHP) to the plurality of active pixel electrodes EP, respectively. For example, the plurality of first switching elements T1 are electrically connected to the plurality of active pixel electrodes EP in one-to-one correspondence. That is, each first switching element T1 is electrically connected to only one active pixel electrode EP, and each active pixel electrode EP is electrically connected to only one first switching element T1.

In at least one embodiment, as shown in FIG. 4A to FIG. 4D, the end of the active pixel electrode EP has a protrusion PP, and the active pixel electrode EP is electrically connected to the first switching element T1 through the protrusion PP. In this case, for example, the orthographic projection of the protrusion PP on the substrate BS overlaps with the orthographic projection of the via hole VHP on the substrate BS. For example, as shown in FIG. 6A, the plurality of switching elements further include a plurality of second switching elements T2 (only one second switching element T2 is shown in FIG. 6A for illustration), the orthographic projection of each second switching element T2 on the substrate BS overlaps with the orthographic projection of one dummy pixel electrode DP on the substrate BS, and the second switching element T2 is electrically isolated from the dummy pixel electrode DP, so there is no via hole VHP between the second switching element T2 and the dummy pixel electrode DP. That is, the active pixel electrode EP is electrically connected to the switching element T, and the dummy pixel electrode DP overlaps with the switching element T but is not electrically connected to the switching element T. For example, the dummy pixel electrode DP also has a protrusion PP corresponding to the switching element T at the end thereof.

In the embodiments of the present disclosure, by providing the dummy pixel electrode DP, the electric field around the active pixel electrode EP becomes more uniform, so that the display effect is better. In addition, in the process of manufacturing the active pixel electrode EP, it is necessary to expose the photoresist coated on the film (hereinafter referred to as the pixel electrode film) for forming the active pixel electrode EP; if the dummy pixel electrode DP is not provided on the outer side of the active pixel electrode EP, the light transmittance of the edge side is higher than that of other regions, the exposure amount of the edge side is larger and the phenomenon of overexposure occurs, which in turn causes the outermost active pixel electrode to be too thin or be broken, thereby affecting the display of pixel regions. Therefore, by providing the dummy pixel electrode DP outside the active pixel electrode EP, the active pixel electrode is effectively protected from overexposure. Furthermore, there is no connection via hole VHP between the dummy pixel DP and the switching element T, so the dummy pixel electrode DP is not used for display.

Figure 6B:
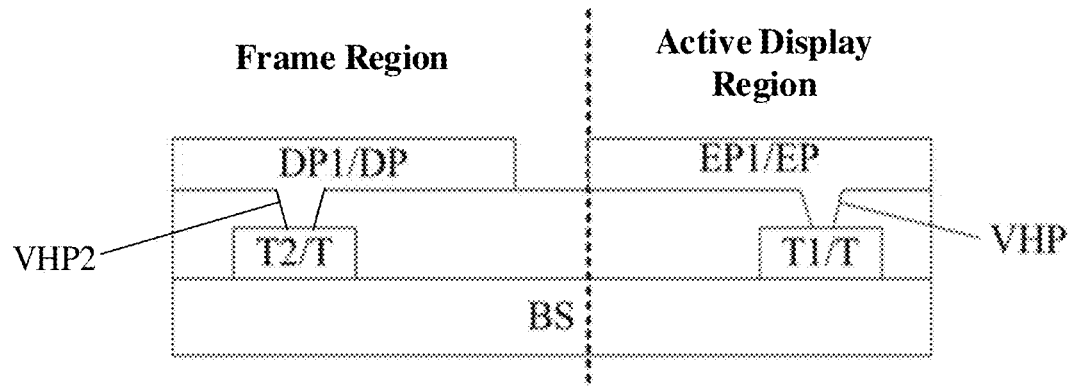
FIG. 6B is another schematic view of the connection relationship between the plurality of switching elements and the active pixel electrodes as well as the dummy pixel electrodes in the display device provided by at least one embodiment of the present disclosure.
Figure 6C:
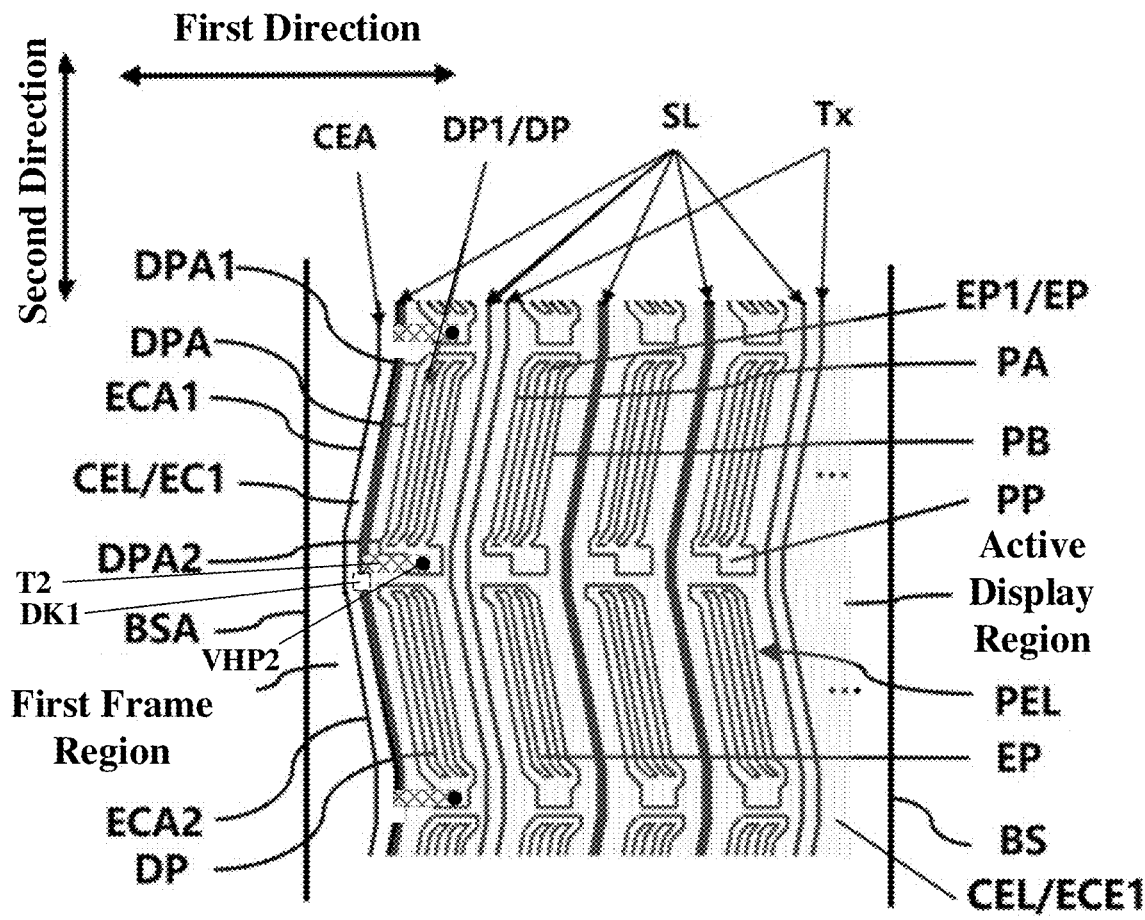
FIG. 6C is another schematic top view of the display device provided by at least one embodiment of the present disclosure in the case where the first extended common electrode extends into the first frame region.

FIG. 6B is another schematic view of a connection relationship between the plurality of switching elements and the active pixel electrodes as well as the dummy pixel electrodes in the display device provided by at least one embodiment of the present disclosure. FIG. 6C is another schematic top view of the display device provided by at least one embodiment of the present disclosure in the case where the first extended common electrode extends into the first frame region.

For example, in other embodiments, as shown in FIG. 6B, the second switching element T2 is electrically connected to the dummy pixel electrode DP. In this case, a via hole VHP2 is provided between the second switching element T2 and the dummy pixel electrode DP. The second switching element T2 is electrically connected to the dummy pixel electrode DP through the via hole VHP2. That is, the dummy pixel electrode DP is electrically connected to the second switching element T2. For example, as shown in FIG. 6C, the second switching element T2 corresponds to an end of the dummy pixel electrode DP (e.g., a first dummy pixel electrode DP1), and the end of the dummy pixel electrode DP also has a protrusion PP corresponding to the second switching element T2. The second switching element T2 is connected to the data line SL and the protrusion PP of the dummy pixel electrode DP. The second switching element T2 is connected to the protrusion PP through the via hole VHP2. The data line SL connected to the dummy pixel electrode DP is broken at an opening DK1 at the position corresponding to the end of the dummy pixel electrode DP to cut off the data signal transmitted by the data line SL, so that the dummy pixel electrode DP is not used for display.

In some embodiments, the plurality of dummy pixel electrodes DP included in the pixel electrode layer PEL are located in the same frame region among the first frame region to the fourth frame region. In other embodiments, the plurality of dummy pixel electrodes DP are located in different frame regions, respectively.

In some embodiments, in the case where the dummy pixel electrode DP is located in the first frame region (as shown in FIG. 4A) or the third frame region (as shown in FIG. 4B), the shape (including the outline and size) of the dummy pixel electrode DP is approximately the same as the shape (including the outline and size) of the active pixel electrode EP ("approximately" refers to ignoring the influence of manufacturing process errors). In some embodiments, in the case where the dummy pixel electrode DP is located in the second frame region (as shown in FIG. 4C) or the fourth frame region (as shown in FIG. 4D) and the second frame region and the fourth frame region are sequentially arranged in the first direction, the length of the dummy pixel electrode DP in the first direction is approximately $\frac{1}{3}$ to $\frac{1}{2}$ of the length of the active pixel electrode EP in the first direction. Because there are many signal lines in the fourth frame region, the length of the dummy pixel electrode DP in the first direction in the case where the dummy pixel electrode DP is located in the fourth frame region is smaller than the length of the dummy pixel electrode DP in the first direction in the case where the dummy pixel electrode DP is located in the second frame region.

In at least one embodiment, as shown in FIG. 3A to FIG. 4D, the plurality of dummy pixel electrodes DP included in the pixel electrode layer PEL include a first dummy pixel electrode DP1, and the orthographic projection of the first dummy pixel electrode DP1 on the substrate BS overlaps with the orthographic projection of the first extended portion EC1 on the substrate BS.

Figure 9:
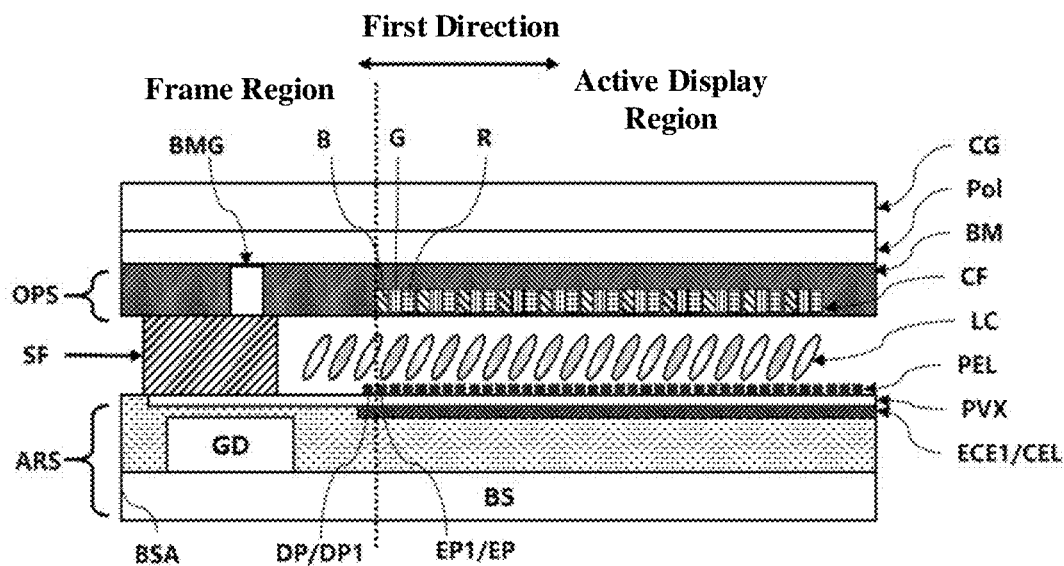
FIG. 9 is a schematic cross-sectional view of a partial structure in the first frame region or the third frame region of the display device provided by at least one embodiment of the present disclosure.

In at least one embodiment, as shown in FIG. 4A to FIG. 4D, in the first direction, the first extended portion edge CEA is located between the first dummy pixel electrode DP1 and the first substrate edge BSA, that is, the orthographic projection of the first extended portion edge CEA on the substrate BS is located between the orthographic projection of the first dummy pixel electrode DP1 on the substrate BS and the first substrate edge BSA. In the embodiments of the present disclosure, the first dummy pixel electrode DP1 is not electrically connected to the switching element T; although the static electricity accumulated at the first extended portion edge CEA generates an electric field between the first extended portion edge CEA and the first dummy pixel electrode DP1, the black matrix BM (as shown in FIG. 9) blocks the first extended portion edge CEA, so that there is no defective bright lines during the film tearing/ESD test.

In some embodiments, the pattern of the dummy pixel electrode DP is consistent with the pattern of the active pixel electrodes EP. For example, as shown in FIG. 4A and FIG. 4B, the dummy pixel electrode DP includes a plurality of strip electrodes spaced apart from each other. For example, as shown in FIG. 4A and FIG. 4B, the strip electrodes of the dummy pixel electrode DP located in the frame region and the strip electrodes of the active pixel electrode EP adjacent to the dummy pixel electrode DP have approximately the same tilt direction and approximately the same length. In other embodiments, the pattern of the dummy pixel electrode DP is different from the pattern of the active pixel electrode EP. For example, as shown in FIG. 4C and FIG. 4D, the strip electrodes of the dummy pixel electrode DP located in the frame region and the strip electrodes of the active pixel electrode EP adjacent to the dummy pixel electrode DP have different tilt directions and have different lengths.

As shown in FIG. 4A to FIG. 4D, the edge of the first dummy pixel electrode DP1 that is closest to the first extended portion EC1 (i.e. the first extended portion edge CEA) and extends in the second direction is the first dummy pixel electrode edge DPA. In some embodiments, as shown in FIG. 4A and FIG. 4B, the first dummy pixel electrode edge DPA of the first dummy pixel electrode DP1 is not linear, and the shape of the first extended portion edge CEA of the first extended common electrode ECE1 also tilts with the shape of the first dummy pixel electrode edge DPA. In other embodiments, as shown in FIG. 4C and FIG. 4D, the first dummy pixel electrode edge DPA of the first dummy pixel electrode DP1 is linear.

For example, as shown in FIG. 4A and FIG. 4B, the first dummy pixel electrode edge DPA includes a first end portion DPA1 and a second end portion DPA2, both of which are bent end portions. For example, the distance from the orthographic projection of the first end portion DPA1 on the substrate BS to the orthographic projection of the first extended portion edge CEA on the substrate BS is not equal to the distance from the orthographic projection of the second end portion DPA2 on the substrate BS to the orthographic projection of the first extended portion edge CEA on the substrate BS. That is, in the case where the first extended portion EC1 is located in the first frame region or the third frame region, the length of the first extended portion EC1 at the position corresponding to the first end portion DPA1 (that is, the length in the first direction) is not equal to the length of the first extended portion EC1 at the position corresponding to the second end portion DPA2 (that is, the length in the first direction). For example, as shown in FIG. 4A, in the second direction, the second end portion DPA2 of the first dummy pixel electrode edge DPA is located between the first end portion DPA1 of the first dummy pixel electrode edge DPA and the protrusion PP; the length, along the first direction, of the first extended portion EC1 corresponding to the first end portion DPA1 is greater than the length, along the first direction, of the portion of the first extended portion EC1 corresponding to the second end portion DPA2; that is, the distance between the first extended portion edge CEA and the first end portion DPA1 in the first direction is greater than the distance between the first extended portion edge CEA and the second end portion DPA2 in the first direction. For example, as shown in FIG. 4B, in the second direction, the second end portion DPA2 of the first dummy pixel electrode edge DPA is located between the first end portion DPA1 of the first dummy pixel electrode edge DPA and the protrusion PP; the length, along the first direction, of the portion of the first extended portion EC1 corresponding to the first end portion DPA1 is smaller than the length, along the first direction, of the portion of the first extended portion EC1 corresponding to the second end portion DPA2, that is, the distance between the first extended portion edge CEA and the first end portion DPA1 in the first direction is smaller than the distance between the first extended portion edge CEA and the second end portion DPA2 in the first direction. For example, as shown in FIG. 4A and FIG. 4B, the first dummy pixel electrode edge DPA includes a connection line between the first end portion DPA1 and the second end portion DPA2, the connection line is substantially linear, and the connection line is substantially parallel to the portion of the first extended portion edge CEA directly facing the connection line. In this way, the first extended portion EC1 has different lengths along the first direction corresponding to different positions of the first dummy pixel electrode edge DPA, thereby effectively avoiding defective bright lines and preventing the first extended portion EC1 from increasing the width of the frame region.

In at least one embodiment, on the basis that the plurality of active pixel electrodes EP include the first active pixel electrode EP1 and the common electrode layer CEL includes the first extended common electrode ECE1, the outermost active pixel electrodes EP of the plurality of active pixel electrodes EP further include a second active pixel electrode, and the second active pixel electrode and the first active pixel electrode correspond to adjacent frame regions, respectively. The common electrode layer CEL further includes a second extended common electrode, and the second extended common electrode and the first extended common electrode ECE1 extend into adjacent frame regions, respectively. That is, the first active pixel electrode EP1 and the first extended common electrode ECE1 correspond to one of the first frame region (as shown in FIG. 4A) and the third frame region (as shown in FIG. 4B), and the second active pixel electrode and the second extended common electrode correspond to one of the second frame region and the fourth frame region; or, the second active pixel electrode and the second extended common electrode correspond to one of the first frame region and the third frame region, and the first active pixel electrode EP1 and the first extended common electrode ECE1 correspond to one of the second frame region (as shown in FIG. 4C) and the fourth frame region (as shown in FIG. 4D).

Figure 7:
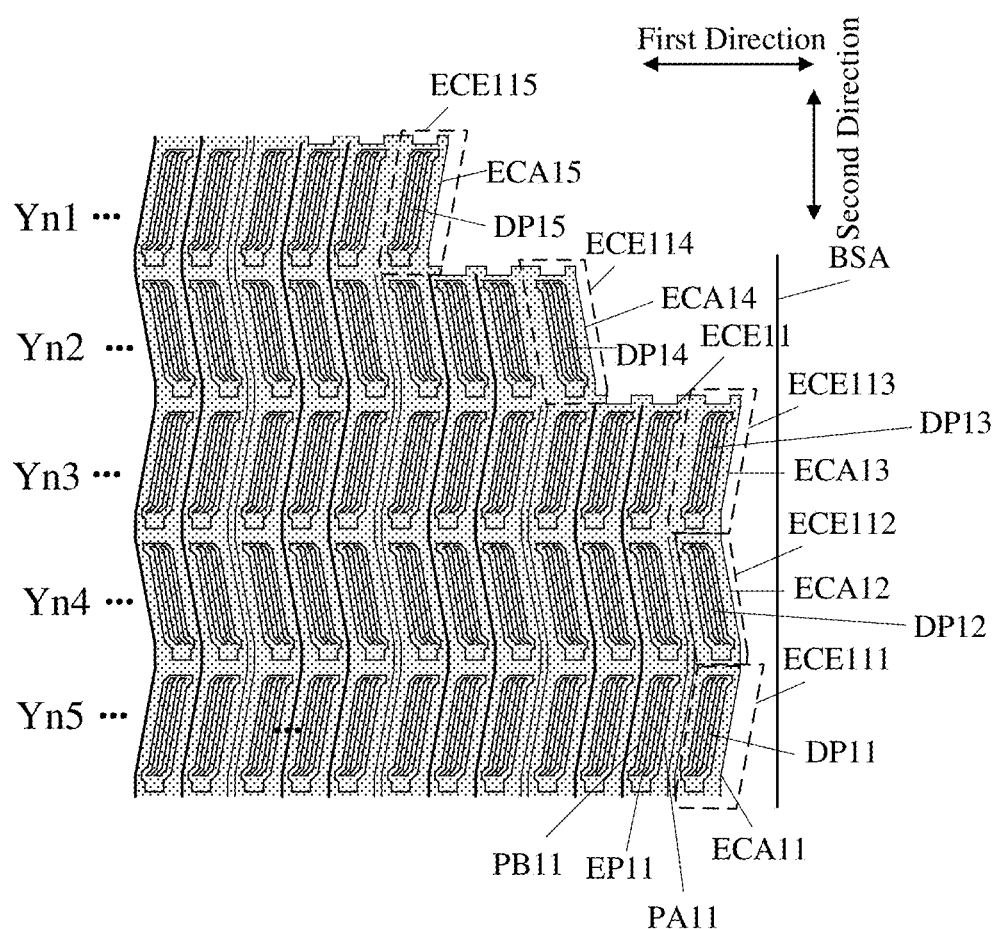
FIG. 7 is a schematic top view of a partial structure at a corner in the display device provided by at least one embodiment of the present disclosure.

FIG. 7 is a schematic top view of a partial structure at a corner in the display device provided by at least one embodiment of the present disclosure. For example, in some embodiments, FIG. 7 shows a schematic structural view of adjacent regions of two frame regions among the first frame region, the second frame region, the third frame region and the fourth frame region at a connection corner of the two frame regions. For example, the corner where the third frame region is connected to the second frame region is taken as an example for introduction, and the structures at other corners are similar, which will not be repeated here. It should be noted that only a part of the structure at one corner is shown in FIG. 7.

For example, in some embodiments, as shown in FIG. 7, in conjunction with FIG. 4B and FIG. 4C, the plurality of first active pixel electrodes EP11 are located in row Yn1, row Yn2, row Yn3, row Yn4 and row Yn5, respectively. For example, the second column from the right in each row in the figure is the active pixel electrode EP11. The first active pixel electrodes EP11 of rows Yn3, Yn4 and Yn5 are located in the same column (the second column from the right in the figure), while the first active pixel electrodes EP11 of rows Yn1 and Yn2 are arranged in a staggered manner and are located in a different column from the first active pixel electrodes EP11 of rows Yn3, Yn4 and Yn5, respectively. Each first active pixel electrode EP11 includes a first pixel electrode edge PA11 and a second pixel electrode edge PB11 extending in the second direction, and the first pixel electrode edge PA11 is closer to the first substrate edge BSA than the second pixel electrode edge PB11. It should be noted that the structure of the first active pixel electrode EP11 in FIG. 7 is the same as the structure of the first active pixel electrode EP1 in FIG. 4B or FIG. 4C, and details are not repeated here.

As shown in FIG. 7, the orthographic projection of the first extended common electrode ECE11 on the substrate BS partially overlaps with the orthographic projection of the first active pixel electrode EP11 on the substrate BS, that is, the first extended common electrode ECE11 includes a portion overlapping with the first active pixel electrode EP11 and includes a portion that does not overlap with the first active pixel electrode EP11. Compared with the first active pixel electrode EP11, the first extended common electrode ECE11 continues to extend towards the first substrate edge BSA. The first extended common electrode ECE11 includes a plurality of first extended portions extending beyond the first active pixel electrodes EP11. The plurality of first extended portions are located in the same row as one of the first active pixel electrodes EP11, respectively. In FIG. 7, the plurality of first extended portions include, for example, a first extended portion ECE111, a first extended portion ECE112, a first extended portion ECE113, a first extended portion ECE114 and a first extended portion ECE115 located in row Yn1, row Yn2, row Yn3, row Yn4 and row Yn5, respectively. Each first extended portion has a first extended portion edge extending in the second direction, and the first extended portion edge is located between the first substrate edge BSA and the first pixel electrode edge PA11 in the first direction. For example, the first extended portion ECE111, the first extended portion ECE112, the first extended portion ECE113, the first extended portion ECE114 and the first extended portion ECE115 include a first extended portion edge ECA11, a first extended portion edge ECA12, a first extended portion edge ECA13, a first extended portion edge ECA14 and a first extended portion edge ECA15, respectively. That is, in the same row, in the first direction, the orthographic projection of the first extended portion edge on the substrate BS is located between the orthographic projection of the first pixel electrode edge PA11 on the substrate BS and the first substrate edge BSA. In this case, the first extended portion edge is located outside the active display region, that is, the first extended portion edge is located in a portion of the frame region that is closest to the first pixel electrode edge.

In the above-mentioned embodiment, by extending the first extended common electrode from the position overlapping with the first active pixel electrode to the frame region (that is, extending to the outside of the active display region), the edge of electrostatic accumulation is extended outward from the active display region shown in FIG. 1 to the outside of the active display region, thereby effectively reducing or eliminating the defective bright lines that occur on the screen of the display device.

For example, in some embodiments, as shown in FIG. 7, the extension directions of the first extended portion edges of the first extended portions of adjacent rows are different from each other. For example, the extension directions of the first extended portion edge ECA11 and the first extended portion edge ECA12 are different, but the extension directions of the first extended portion edge ECA11 and the first extended portion edge ECA13 are the same. The extension directions of the plurality of first extended portion edges are alternately arranged in the second direction to reduce the width of the frame region of the display device.

For example, in some embodiments, as shown in FIG. 7, the first extended portion edges of the at least two first extended portions are arranged in a staggered manner. For example, the first extended portion edge ECA14 and the first extended portion edge ECA15 are located in different columns to form a staggered structure, thereby forming a smooth corner.

For example, in some embodiments, as shown in the figures, the plurality of dummy pixel electrodes DP include a first dummy pixel electrode DP11, a first dummy pixel electrode DP12, a first dummy pixel electrode DP13, a first dummy pixel electrode DP14 and a first dummy pixel electrode DP15 located in row Yn1, row Yn2, row Yn3, row Yn4 and row Yn5, respectively (for example, one first dummy pixel electrode is provided in the rightmost column of each row in the figure). The orthographic projection of the first dummy pixel electrode DP on the substrate BS overlaps with the orthographic projection of the first extended portion of the row where the first dummy pixel electrode DP is located on the substrate BS. For example, in row Yn5, the orthographic projection of the first dummy pixel electrode DP11 on the substrate BS overlaps with the orthographic projection of the first extended portion ECE111 of the row (that is, the row Yn5) where the first dummy pixel electrode DP11 is located on the substrate BS. In the first direction, the first extended portion edge is located between the first dummy pixel electrode and the first substrate edge BSA, that is, the orthographic projection of the first extended portion edge on the substrate BS is located between the orthographic projection of the first dummy pixel electrode on the substrate BS and the first substrate edge BSA. For example, in row Yn5, the orthographic projection of the first extended portion edge ECA11 on the substrate BS is located between the orthographic projection of the first dummy pixel electrode DP11 on the substrate BS and the first substrate edge BSA. In the embodiments of the present disclosure, the first dummy pixel electrode is not electrically connected to the switching element; although the static electricity accumulated at the first extended portion edge may generate an electric field between the first extended portion edge and the first dummy pixel electrode, the black matrix BM (as shown in FIG. 9) blocks the first extended portion edge, so that there is no defective bright lines during the film tearing/ESD test.

Figure 8A:
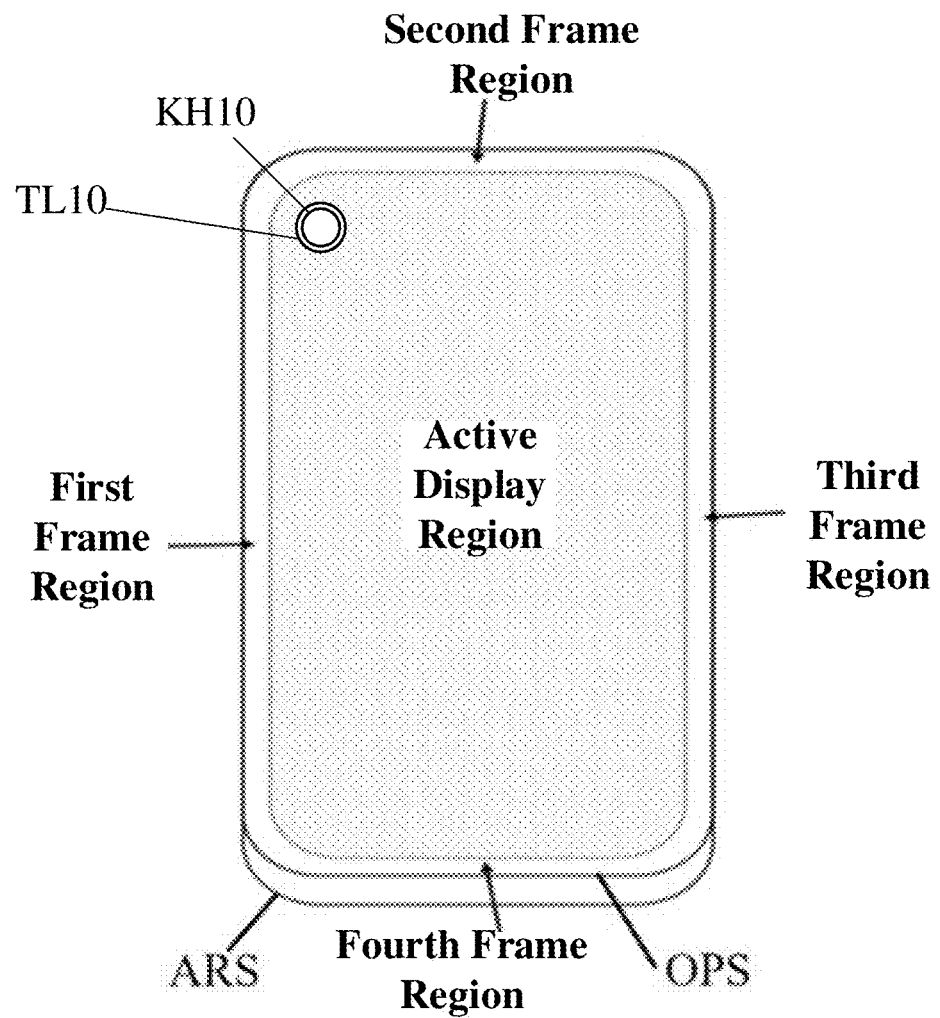
FIG. 8A is a schematic structural view of a frame region including a light-transmitting region in the display device provided by at least one embodiment of the present disclosure.
Figure 8B:
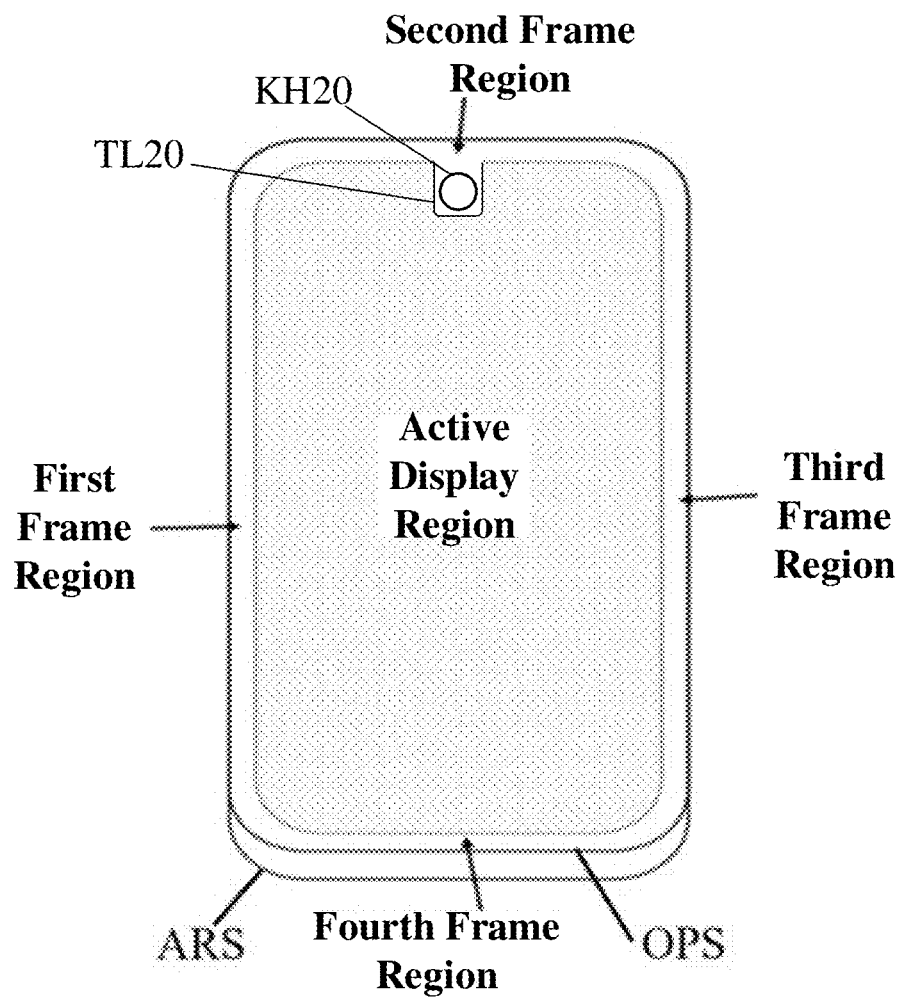
FIG. 8B is another schematic structural view of the frame region including the light-transmitting region in the display device provided by at least one embodiment of the present disclosure.
Figure 8C:
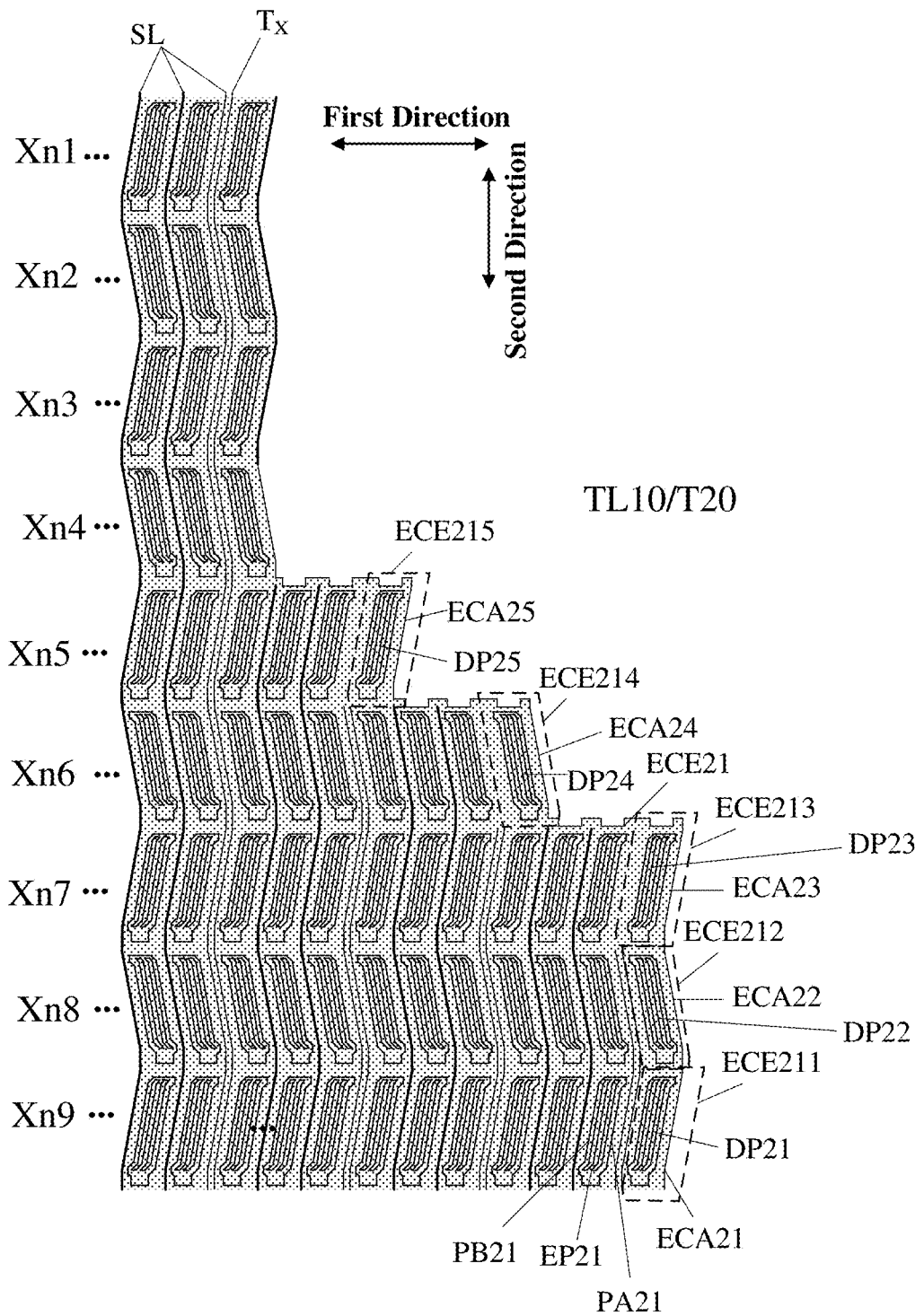
FIG. 8C is a schematic structural view of a pixel electrode layer and a common electrode layer near the light-transmitting region in the display device provided by at least one embodiment of the present disclosure.

FIG. 8A is a schematic structural view of a frame region including a light-transmitting region in the display device provided by at least one embodiment of the present disclosure. FIG. 8B is another schematic structural view of the frame region including the light-transmitting region in the display device provided by at least one embodiment of the present disclosure. FIG. 8C is a schematic structural view of a pixel electrode layer and a common electrode layer near a light-transmitting region in the display device provided by at least one embodiment of the present disclosure.

For example, in some embodiments, as shown in FIG. 8A, the frame region further includes a light-transmitting region TL10, and at least a part of the edge of the light-transmitting region TL10 is surrounded by the active display region. For example, the light-transmitting region TL10 is located at the upper left corner of the active display region, and the light-transmitting region TL10 is surrounded by the active display region. An opening KH10 is provided in the light-transmitting region TL10 to allow light to pass through the opening KH10. For example, a front camera is provided at the opening KH10.

For example, in some embodiments, as shown in FIG. 8B, the light-transmitting region TL20 is also provided on the upper edge of the display region, and edges of the light-transmitting region TL20 except the edge of the second frame region is surrounded by the active display region. For example, the light-transmitting region TL20 is provided with an opening KH20.

It should be noted that the embodiments of the present disclosure are not limited by the position of the light-transmitting region. FIG. 8C shows a schematic structural view of a pixel electrode layer and a common electrode layer at the connection position between the active display region and the light-transmitting region. FIG. 8C only shows a part of the structure at the connection position between the active display region and the light-transmitting region.

For example, in some embodiments, as shown in FIG. 8C, the plurality of active pixel electrodes include a plurality of second active pixel electrodes that are closest to the light-transmitting region TL10/TL20 and arranged along the circumferential direction of the light-transmitting region TL10/TL20, for example, the second active pixel electrodes EP21 located in rows Xn1 to Xn9, respectively (the second active pixel electrodes are arranged at the second column from the right in the same row in the figure). The second active pixel electrodes EP21 of rows Xn7, Xn8 and Xn9 are located in the same column, while the second active pixel electrodes EP21 of rows Xn5 and Xn6 are arranged in a staggered manner and are respectively located in different columns from the second active pixel electrodes of rows Xn7, Xn8 and Xn9. Each of the plurality of second active pixel electrodes EP21 includes a third pixel electrode edge PA21 and a fourth pixel electrode edge PB21 arranged in the first direction and extending in the second direction, and the third pixel electrode edge PA21 is located between the fourth pixel electrode edge PB21 and the light-transmitting region TL10/TL20 in the first direction. It should be noted that the structure of the second active pixel electrode EP21 in FIG. 7 is the same as the structure of the first active pixel electrode EP1 in FIG. 4B or FIG. 4C, and details thereof are not repeated here.

For example, in some embodiments, as shown in FIG. 8C, the common electrode layer includes a second extended common electrode ECE21, and the orthographic projection of the second extended common electrode ECE21 on the substrate BS partially overlaps with the orthographic projections of the plurality of second active pixel electrodes EP21 on the substrate BS. Compared with the second active pixel electrodes EP21, the second extended common electrode ECE21 continues to extend towards the light-transmitting region TL10/TL20. The second extended common electrode ECE21 includes a second extended portion extending beyond the plurality of second active pixel electrodes EP21, and the second extended portion includes a plurality of sub extended portions respectively corresponding to the plurality of second active pixel electrodes EP21. For example, each of the plurality of sub extended portions is located in the same row as one of the second active pixel electrodes EP21. The plurality of sub extended portions include, for example, a sub extended portion ECE211, a sub extended portion ECE212, a sub extended portion ECE213, a sub extended portion ECE214 and a sub extended portion ECE215 located in rows Xn5 to Xn9, respectively. It should be noted that the sub extended portions are also provided in rows Xn1 to Xn4 in the figure, which will not be listed one by one here.

For example, in some embodiments, as shown in FIG. 8C, each of the plurality of sub extended portions has a first sub extended portion edge extending in the second direction, and the first sub extended portion edge is located between the light-transmitting region TL10/TL20 and the third pixel electrode edge PA21 in the first direction. For example, the sub extended portion ECE211, the sub extended portion ECE212, the sub extended portion ECE213, the sub extended portion ECE214 and the sub extended portion ECE215 include a first sub extended portion edge ECA21, a first sub extended portion edge ECA22, a first sub extended portion edge ECA23, a first sub extended portion edge ECA24 and a first sub extended portion edge ECA25, respectively. That is, in the same row, in the first direction, the orthographic projection of the first sub extended portion edge on the substrate BS is located between the orthographic projection of the third pixel electrode edge PA21 on the substrate BS and the light-transmitting region TL10/TL20. In this case, the first sub extended portion edge is located outside the active display region, that is, the first sub extended portion edge is located in a portion of the frame region closest to the third pixel electrode edge.

In the above-mentioned embodiment, by extending the second extended common electrode from the position overlapping with the second active pixel electrode towards the light-transmitting region (that is, extending the second extended common electrode into the outside of the active display region), the edge of electrostatic accumulation extends outward from the active display region shown in FIG. 1 to the outside of the active display region, thereby effectively reducing or eliminating the defective bright lines that occur on the screen of the display device.

For example, in some embodiments, as shown in FIG. 8C, the extension directions of the first sub extended portion edges of two sub extended portions adjacently provided along the circumferential direction of the light-transmitting region TL10/TL20 are different from each other. For example, the extension directions of the first sub extended portion edge ECA21 and the first sub extended portion edge ECA22 are different from each other, but the extension directions of the first sub extended portion edge ECA21 and the first sub extended portion edge ECA23 are the same. The extension directions of the plurality of first sub extended portion edges are alternately arranged in the second direction to save the arrangement space.

For example, in some embodiments, as shown in FIG. 8C, the first sub extended portion edges of at least two sub extended portions are arranged in a staggered manner in the first direction. For example, the first sub extended portion edge ECA24 and the first sub extended portion edge ECA25 are located in different columns to form a staggered structure, thereby forming a smooth arc-shaped connection structure.

For example, in some embodiments, as shown in FIG. 8C, the plurality of dummy pixel electrodes further include a plurality of second dummy pixel electrodes located between the second active pixel electrodes EP21 and the light-transmitting region TL10/TL20 in the first direction (for example, one second dummy pixel electrode is provided in the rightmost column of each row in the figure). For example, the plurality of second dummy pixel electrodes include a second dummy pixel electrode DP21, a second dummy pixel electrode DP22, a second dummy pixel electrode DP23, a second dummy pixel electrode DP24 and a second dummy pixel electrode DP25 located in rows Xn5 to Xn9, respectively. The orthographic projections of the plurality of second dummy pixel electrodes on the substrate at least partially overlap with the orthographic projections of the plurality of sub extended portions of the second extended portion on the substrate. For example, in row Xn9, the orthographic projection of the second dummy pixel electrode DP21 on the substrate BS overlaps with the orthographic projection of the second extended portion ECE211 on the substrate BS.

For example, in some embodiments, as shown in FIG. 8C, each of the first sub extended portion edges of the plurality of sub extended portions is located between the second dummy pixel electrode corresponding to the each of the first sub extended portion edges and the light-transmitting region TL10/TL20. That is, the orthographic projection of the of the first sub extended portion edge on the substrate BS is located between the orthographic projection of the second dummy pixel electrode on the substrate BS and the light-transmitting region TL10/TL20. For example, in row Xn9, the orthographic projection of the first sub extended portion edge ECA21 on the substrate BS is located between the orthographic projection of the second dummy pixel electrode DP21 on the substrate BS and the light-transmitting region TL10/TL20. In the embodiments of the present disclosure, the second dummy pixel electrode is not electrically connected to the switching element; although the static electricity accumulated at the first extended portion edge may generate an electric field between the first extended portion edge and the first dummy pixel electrode, the black matrix BM blocks the first sub extended portion edge, so that there is no defective bright lines during the film tearing/ESD test.

For example, the second extended common electrode ECE21 is one of the plurality of sub common electrodes TE shown in FIG. 5. It should be noted that, as shown in FIG. 8A, in the case where the light-transmitting region TL10 is located at the upper left corner of the active display region, and the light-transmitting region TL10 is surrounded by the active display region, the first extended common electrode located at the upper left corner of the active display region simultaneously serves as the second extended common electrode. In this case, the first extended common electrode includes an edge close to the first frame region and the second frame region and a corner connecting the first frame region and the second frame region, and further includes a region surrounding the light-transmitting region TL10.

For example, the second extended common electrode is an integral structure.

For example, the absolute value of the working voltage of the second extended common electrode is less than or equal to 0.2V.

For example, one of the array substrate and the opposite substrate includes a black matrix layer, and the black matrix layer blocks the second extended portion of the second extended common electrode.

For example, in some embodiments, the region where the second dummy pixel electrode DP21 is located in FIG. 8C is not provided with a switching element, that is, the region where the orthographic projection of the second dummy pixel electrode DP21 on the substrate BS is located is not provided with a switching element, so that the second dummy pixel electrode DP21 is not used for display.

FIG. 9 is a schematic cross-sectional view of a partial structure in the first frame region or the third frame region of the display device provided by at least one embodiment of the present disclosure.

For example, as shown in FIG. 9, the display device has a gate driving circuit GD provided in the first frame region or the third frame region. For example, the gate driving circuit is a GOA (Gate Driver on Array).

For example, as shown in FIG. 9, the black matrix layer BM blocks the portion (that is, the above-mentioned first extended portion EC1) of the first extended common electrode ECE1 extending beyond the first active pixel electrode EP1. In some embodiments, the display device further includes a sealant SF connecting the array substrate ARS and the opposite substrate OPS, the black matrix layer BM has a groove BMG at the sealant SF, and the thickness of the groove BMG is equal to the thickness of the black matrix layer BM, that is, the groove BMG is a through groove penetrating through the black matrix layer BM. By providing the groove BMG in the black matrix layer BM, the anti-ESD capability of the display device is improved. In some embodiments, the orthographic projection of the groove BMG on the substrate BS is a closed or non-closed annular structure surrounding the active display region. In some embodiments, the groove BMG is filled with a filter material. For example, the filter material is a blue filter material. By filling the groove BMG with a filter material, light leakage is avoided.

In some embodiments, as shown in FIG. 9, the display device further includes a polarizer Pol located on the side of the opposite substrate OPS away from the array substrate ARS. For example, the resistance of the polarizer Pol is not greater than $3*10^9\Omega$. By adopting a low-resistance polarizer, it is beneficial to reduce the electrostatic accumulation during the film tearing/ESD test, thereby reducing or eliminating the occurrence of defective bright lines.

Figure 10:
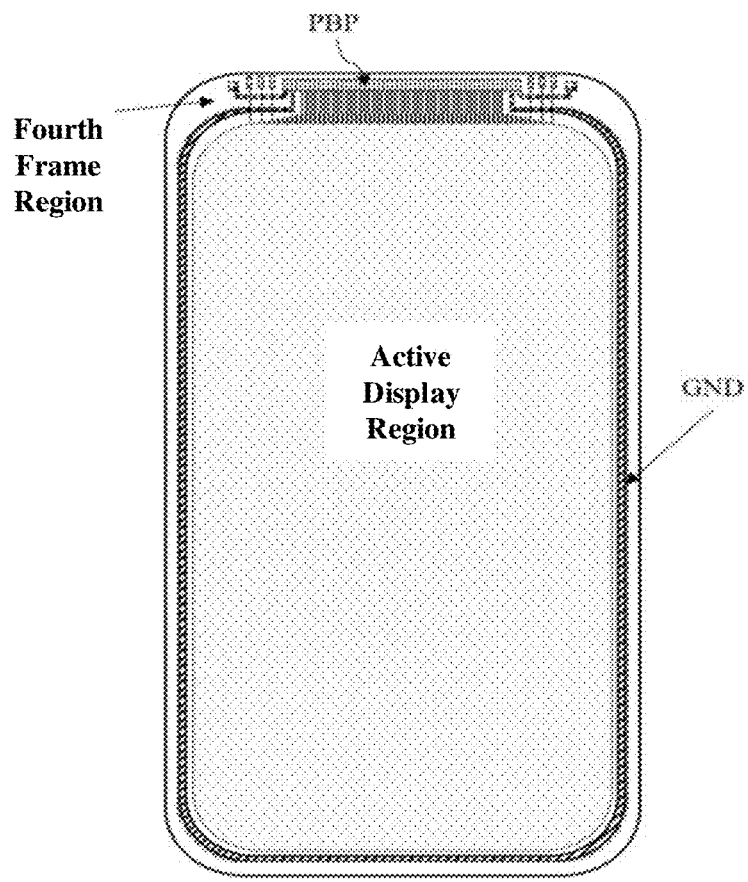
FIG. 10 is a schematic top view of a ground line in the display device provided by at least one embodiment of the present disclosure.

In some embodiments, the display device further includes a ground line on the substrate BS. FIG. 10 is a schematic top view of a ground line in the display device provided by at least one embodiment of the present disclosure. For example, as shown in FIG. 10, the ground line GND surrounds the active display region, and the line width of the ground line GND is less than or equal to 50 μm. The line width of the ground line GND is narrow, which is conducive to realizing a narrow frame design. For example, as shown in FIG. 10, two connection terminals of the ground line GND are located in the fourth frame region, and panel bonding pins PBP are further provided in the fourth frame region.

Figure 11A:
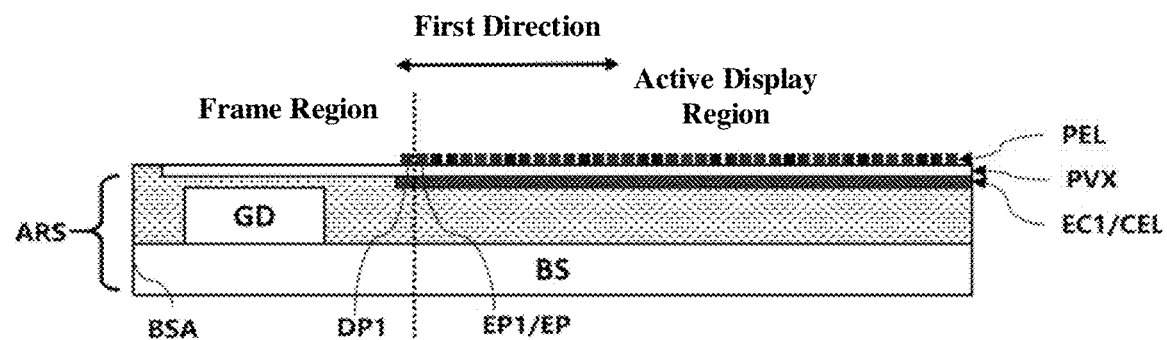
FIG. 11A is a schematic partial cross-sectional view of a partial structure of an array substrate provided by at least one embodiment of the present disclosure.
Figure 11B:
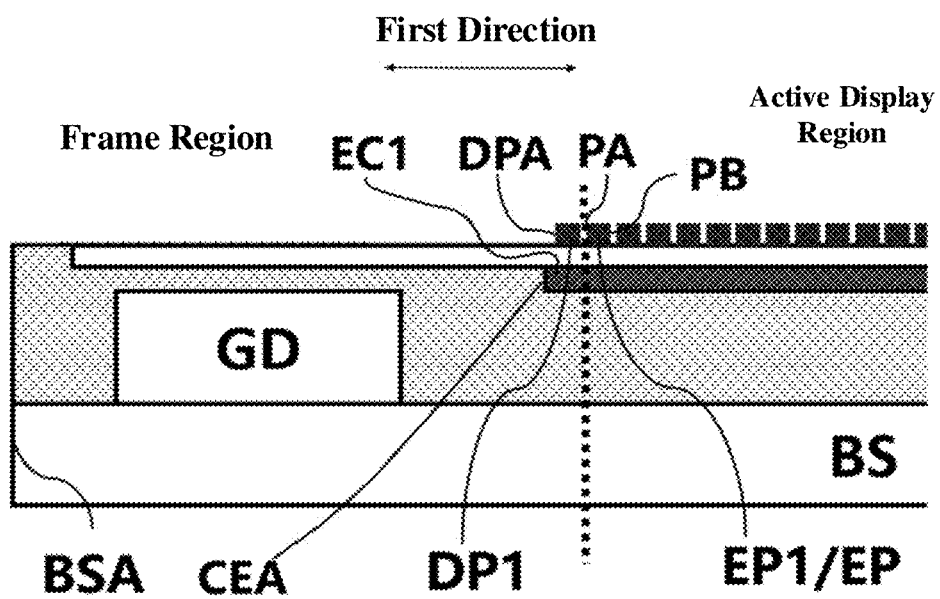
FIG. 11B is a schematic partial enlarged view of FIG. 11A.

At least one embodiment of the present disclosure further provides an array substrate. FIG. 11A is a schematic partial cross-sectional view of a partial structure of an array substrate provided by at least one embodiment of the present disclosure. FIG. 11B is a schematic partial enlarged view of FIG. 11A. As shown in FIG. 11A and FIG. 11B, the array substrate ARS has an active display region and a frame region outside the active display region. The array substrate ARS includes a substrate BS and a pixel electrode layer PEL located on the substrate BS. The pixel electrode layer PEL includes a plurality of active pixel electrodes EP located in the active display region; outermost active pixel electrodes of the plurality of active pixel electrodes EP include a first active pixel electrode EP1, and the first active pixel electrode EP1 includes a first pixel electrode edge PA and a second pixel electrode edge PB arranged in the first direction and each extending in the second direction different from the first direction. The first pixel electrode edge PA and the second pixel electrode edge PB are edges included in the first active pixel electrode EP1 that are farthest apart from each other in the first direction, and the first pixel electrode edge PA is located between the second pixel electrode edge PB and the frame region in the first direction. The array substrate ARS further includes a common electrode layer CEL, and the common electrode layer CEL includes a first extended common electrode ECE1 of block-shaped, and an orthographic projection of the first extended common electrode ECE1 on the substrate BS partially overlaps with the orthographic projection of the first active pixel electrode EP1 on the substrate BS. The first extended common electrode ECE1 includes a first extended portion EC1 extending beyond the first active pixel electrode EP1, the first extended portion EC1 has a first extended portion edge CEA extending in the second direction. The edge of the substrate BS that is closest to the first extended portion edge CEA and extends in the second direction is a first substrate edge BSA, and the first extended portion edge CEA is located between the first substrate edge BSA and the first pixel electrode edge PA in the first direction.

In the embodiments of the present disclosure, by extending the first extended common electrode ECE1 from a position overlapping with the first active pixel electrode EP1 into the frame region (that is, extending the first extended common electrode ECE1 into the outside of the active display region), the edge of electrostatic accumulation is extended outward from the active display region shown in FIG. 1 to the outside of the active display region, thereby effectively reducing or eliminating the defective bright lines that occur on the screen of the display device.

In at least one embodiment, the absolute value of the working voltage of the first extended common electrode ECE1 is less than or equal to 0.2V. In this way, vertical block defects caused by an excessively large voltage difference between the first extended common electrode ECE1 and the active pixel electrode EP is avoided.

In some embodiments, the common electrode layer CEL includes a plurality of sub common electrodes spaced apart from each other, the plurality of sub common electrodes are multiplexed as touch electrodes, and the first extended common electrode ECE1 is one of the plurality of sub common electrodes. For example, the first extended common electrode ECE1 is an integral structure.

In at least one embodiment, the ratio of the area of the first extended portion EC1 to the area of the first extended common electrode ECE1 is not greater than 1% to avoid affecting the touch performance.

In some embodiments, the array substrate includes a first frame region, a second frame region, a third frame region and a fourth frame region sequentially arranged in a clockwise direction, and the first extended common electrode ECE1 is located in at least one of the first frame region to the fourth frame region.

In some embodiments, the first extended portion EC1 is located in the first frame region or the third frame region; and in the first direction, the ratio of the length of the first extended portion EC1 to the length of the first active pixel electrode EP1 is greater than or equal to 1 and less than or equal to 2.

In at least one embodiment, the pixel electrode layer PEL further includes a plurality of dummy pixel electrodes spaced apart from the plurality of active pixel electrodes EP, and the plurality of dummy pixel electrodes are located in the frame region. For example, the plurality of dummy pixel electrodes include a first dummy pixel electrode overlapping with the first extended common electrode. In some embodiments, the common electrode layer CEL further includes a second extended common electrode, and the plurality of dummy pixel electrodes further includes a second dummy pixel electrode overlapping with the second extended common electrode.

The same components in the above-mentioned embodiments of the array substrate and the above-mentioned embodiments of the display device may be provided in the same manner, and repeated descriptions will not be repeated here.

Furthermore, the embodiments of the present disclosure and features in the embodiments can be combined with each other without conflict.

What have been described above are only exemplary embodiments of the present disclosure, and are not intended to limit the protection scope of the present disclosure, and the protection scope of the present disclosure is determined by the appended claims.

What is claimed is:

1. A display device, comprising an active display region and a frame region outside the active display region, and comprising an array substrate and an opposite substrate provided opposite to each other, wherein the array substrate comprises a substrate and a pixel electrode layer provided on the substrate, the pixel electrode layer comprises a plurality of active pixel electrodes located in the active display region; outermost active pixel electrodes of the plurality of active pixel electrodes comprise a first active pixel electrode, the first active pixel electrode comprises a first pixel electrode edge and a second pixel electrode edge arranged in a first direction and each extending in a second direction; in the first direction, the first pixel electrode edge is located between the second pixel electrode edge and the frame region, and the first direction and the second direction intersect each other;

one of the array substrate and the opposite substrate comprises a common electrode layer; the common electrode layer comprises a first extended common electrode of block-shaped, an orthographic projection of the first extended common electrode on the substrate partially overlaps with an orthographic projection of the first active pixel electrode on the substrate; the first extended common electrode comprises a first extended portion extending beyond the first active pixel electrode, the first extended portion has a first extended portion edge extending in the second direction, the substrate has a first substrate edge extending in the second direction; and in the first direction, the first extended portion edge is located between the first substrate edge and the first pixel electrode edge;

the common electrode layer comprises a plurality of sub common electrodes spaced apart from each other, the first extended common electrode is one of outermost sub common electrodes among the plurality of sub common electrodes, and an area of the first extended common electrode is larger than an area of another sub common electrode other than the outermost sub common electrodes;

the plurality of sub common electrodes are multiplexed as touch electrodes, and the first extended common electrode and the second extended common electrode are one of the plurality of sub common electrodes, respectively; and each of the first extended common electrode and the second extended common electrode is an integral structure.

2. The display device according to claim 1, wherein in the first direction, a length of the first extended portion is greater than or equal to ⅓ of a length of the first active pixel electrode; and a ratio of an area of the first extended portion to an area of the first extended common electrode is not greater than 1%.

3. The display device according to claim 1, wherein the frame region comprises a first frame region, a second frame region, a third frame region and a fourth frame region which are sequentially arranged in a clockwise direction;

the array substrate has a protrusion portion beyond the opposite substrate, and the protrusion portion is located in the fourth frame region; and the first extended portion is located in at least one of the first frame region to the fourth frame region.

4. The display device according to claim 3, wherein the first extended portion is located in the first frame region and/or the third frame region; and in the first direction, a ratio of a length of the first extended portion to a length of the first active pixel electrode is greater than or equal to 1.

5. The display device according to claim 3, wherein the first extended portion is located in the second frame region and/or the fourth frame region; and in the first direction, a ratio of a length of the first extended portion to a length of the first active pixel electrode is greater than or equal to ⅓ and less than or equal to ½.

6. The display device according to claim 1, wherein the pixel electrode layer further comprises a plurality of dummy pixel electrodes spaced apart from the plurality of active pixel electrodes, and the plurality of dummy pixel electrodes are located in the frame region.

7. The display device according to claim 6, wherein the plurality of dummy pixel electrodes comprise a first dummy pixel electrode, and an orthographic projection of the first dummy pixel electrode on the substrate at least partially overlaps with an orthographic projection of the first extended portion on the substrate.

8. The display device according to claim 7, wherein in the first direction, the first extended portion edge is located between the first dummy pixel electrode and the first substrate edge.

9. The display device according to claim 8, wherein an edge of the first dummy pixel electrode closest to the first extended portion edge and extending in the second direction is a first dummy pixel electrode edge, and the first dummy pixel electrode edge comprises a first end portion and a second end portion;

in the first direction, a distance from the first end portion to the first extended portion edge is not equal to a distance from the second end portion to the first extended portion edge; and the first dummy pixel electrode edge comprises a connection line between the first end portion and the second end portion, and the connection line is parallel to the first extended portion edge.

10. The display device according to claim 6, wherein the frame region further comprises a light-transmitting region, and at least a partial edge of the light-transmitting region is surrounded by the active display region;

the plurality of active pixel electrodes comprise a plurality of second active pixel electrodes arranged closest to the light-transmitting region and along a circumferential direction of the light-transmitting region; each of the plurality of second active pixel electrodes comprises a third pixel electrode edge and a fourth pixel electrode edge arranged in the first direction and each extending in the second direction; and in the first direction, the third pixel electrode edge is located between the fourth pixel electrode edge and the light-transmitting region;

the common electrode layer comprises a second extended common electrode, an orthographic projection of the second extended common electrode on the substrate partially overlaps with an orthographic projection of each of the plurality of second active pixel electrodes on the substrate; the second extended common electrode comprises a second extended portion extending beyond each of the plurality of second active pixel electrodes, and the second extended portion comprises a plurality of sub extended portions respectively corresponding to the plurality of second active pixel electrodes; and each of the plurality of sub extended portions has a first sub extended portion edge extending in the second direction; and in the first direction, the first sub extended portion edge is located between the light-transmitting region and the third pixel electrode edge.

11. The display device according to claim 10, wherein extension directions of first sub extended portion edges of two of the plurality of sub extended portions provided adjacently along the circumferential direction of the light-transmitting region are different from each other.

12. The display device according to claim 10, wherein first sub extended portion edges of at least two of the plurality of sub extended portions are arranged in a staggered manner in the first direction.

13. The display device according to claim 10, wherein the plurality of dummy pixel electrodes further comprise a plurality of second dummy pixel electrodes located between the plurality of second active pixel electrodes and the light-transmitting region in the first direction; and orthographic projections of the plurality of second dummy pixel electrodes on the substrate at least partially overlap with orthographic projections of the plurality of sub extended portions of the second extended portion on the substrate.

14. The display device according to claim 13, wherein first sub extended portion edges of the plurality of sub extended portions are located between the plurality of second dummy pixel electrodes and the light-transmitting region.

15. The display device according to claim 6, wherein the array substrate further comprises a plurality of switching elements on the substrate and spaced apart from each other, the plurality of switching elements comprise a plurality of first switching elements, and the plurality of first switching elements are electrically connected to the plurality of active pixel electrodes, respectively.

16. The display device according to claim 15, wherein the plurality of switching elements further comprise a plurality of second switching elements, and orthographic projections of the plurality of second switching elements on the substrate at least partially overlap with orthographic projections of the plurality of dummy pixel electrodes on the substrate, respectively.

17. The display device according to claim 1, further comprising a ground line surrounding the active display region, wherein a line width of the ground line is less than or equal to 50 microns.

18. The display device according to claim 10, wherein
one of the array substrate and the opposite substrate comprises a black matrix layer, and the black matrix layer blocks the first extended portion of the first extended common electrode and the second extended portion of the second extended common electrode;
the display device further comprises an annular sealant connecting the array substrate and the opposite substrate, and the black matrix layer has an annular groove at the sealant; and
the groove is filled with a filter material.

19. An array substrate, comprising an active display region and a frame region outside the active display region, wherein
the array substrate comprises a substrate and a pixel electrode layer provided on the substrate, the pixel electrode layer comprises a plurality of active pixel electrodes located in the active display region; outermost active pixel electrodes of the plurality of active pixel electrodes comprise a first active pixel electrode, the first active pixel electrode comprises a first pixel electrode edge and a second pixel electrode edge arranged in a first direction and each extending in a second direction; and in the first direction, the first pixel electrode edge is located between the second pixel electrode edge and the frame region, and the first direction and the second direction intersect each other;
the array substrate comprises a common electrode layer, the common electrode layer comprises a first extended common electrode of block-shaped; an orthographic projection of the first extended common electrode on the substrate partially overlaps with an orthographic projection of the first active pixel electrode on the substrate; the first extended common electrode comprises a first extended portion extending beyond the first active pixel electrode, the first extended portion has a first extended portion edge extending in the second direction, the substrate has a first substrate edge extending in the second direction; and in the first direction, the first extended portion edge is located between the first substrate edge and the first pixel electrode edge; and the common electrode layer comprises a plurality of sub common electrodes spaced apart from each other, the first extended common electrode is one of outermost sub common electrodes among the plurality of sub common electrodes, and an area of the first extended common electrode is larger than an area of another sub common electrode other than the outermost sub common electrodes;

the plurality of sub common electrodes are multiplexed as touch electrodes, and the first extended common electrode and the second extended common electrode are one of the plurality of sub common electrodes, respectively; and each of the first extended common electrode and the second extended common electrode is an integral structure.

20. The display device according to claim 1, wherein the frame region includes a first frame region, a second frame region, a third frame region and a fourth frame region which are sequentially arranged in a clockwise direction;
wherein the first extended common electrode corresponds to one of the first frame region and the third frame region, and the second extended common electrode corresponds to one of the second frame region and the fourth frame region.

* * * * *